US011758722B2

(12) United States Patent
Xiao

(10) Patent No.: US 11,758,722 B2
(45) Date of Patent: Sep. 12, 2023

(54) THREE-DIMENSIONAL MEMORY DEVICE WITH DEPOSITED SEMICONDUCTOR PLUGS AND METHODS FOR FORMING THE SAME

(71) Applicant: YANGTZE MEMORY TECHNOLOGIES CO., LTD., Wuhan (CN)

(72) Inventor: Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 739 days.

(21) Appl. No.: 16/455,626

(22) Filed: Jun. 27, 2019

(65) Prior Publication Data

US 2020/0328225 A1    Oct. 15, 2020

Related U.S. Application Data

(63) Continuation of application No. PCT/CN2019/082460, filed on Apr. 12, 2019.

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC .......................... H01L 27/1158–11582; H01L 27/11553–11556; H01L 27/11273;
(Continued)

(56) References Cited

U.S. PATENT DOCUMENTS 9,525,065 B1 * 12/2016 Kyeon ................ H01L 29/7827
9,570,463 B1 *  2/2017 Zhang ............... H01L 27/11582
(Continued)

FOREIGN PATENT DOCUMENTS

CN      104520992 A      4/2015
CN      107039443 A      8/2017
(Continued)

OTHER PUBLICATIONS

International Search Report issued in corresponding International Application No. PCT/CN2019/082460, dated Jan. 2, 2020, 4 pages.
(Continued)

*Primary Examiner* — Amar Movva
(74) *Attorney, Agent, or Firm* — BAYES PLLC

(57) ABSTRACT

Embodiments of 3D memory devices and the fabrication methods to form the 3D memory devices are provided. A 3D memory device includes a substrate, a memory deck, and a memory string. The memory deck includes a plurality of interleaved conductor layers and dielectric layers on the substrate. The memory string extends vertically through the memory deck. A bottom conductor layer of the plurality of interleaved conductor layers and dielectric layers can intersect with and contact the memory string.

20 Claims, 13 Drawing Sheets

(51) Int. Cl.
*H10B 41/27* (2023.01)
*H10B 41/35* (2023.01)
*H10B 43/10* (2023.01)
*H10B 43/35* (2023.01)

(58) Field of Classification Search
CPC ......... H01L 27/11514; H01L 27/11597; H01L 27/2481; H01L 27/11568–1157; H01L 27/11521; H01L 27/11524; H10B 41/23; H10B 41/27; H10B 20/40; H10B 53/20; H10B 51/20; H10B 63/84; H10B 43/30; H10B 43/35; H10B 41/30; H10B 41/35
See application file for complete search history.

(56) References Cited

U.S. PATENT DOCUMENTS

| | | | |
|---|---|---|---|
| 9,659,956 | B1 | 5/2017 | Pachamuthu et al. |
| 9,728,551 | B1 | 8/2017 | Lu et al. |
| 2015/0055413 | A1* | 2/2015 | Alsmeier ............ H01L 27/1157 438/106 |
| 2015/0076584 | A1 | 3/2015 | Pachamuthu et al. |
| 2015/0076586 | A1 | 3/2015 | Rabkin et al. |
| 2015/0371993 | A1 | 12/2015 | Jung |
| 2016/0343729 | A1* | 11/2016 | Shin ................. H01L 29/40114 |
| 2017/0103997 | A1* | 4/2017 | Lee .................... H01L 29/7827 |
| 2018/0006049 | A1 | 1/2018 | Inomata et al. |
| 2018/0138193 | A1 | 5/2018 | Zhang et al. |
| 2019/0081060 | A1 | 3/2019 | Lu et al. |
| 2019/0096904 | A1 | 3/2019 | Noguchi et al. |

FOREIGN PATENT DOCUMENTS

| | | |
|---|---|---|
| CN | 107305896 A | 10/2017 |
| CN | 107527921 A | 12/2017 |
| CN | 107731741 A | 2/2018 |
| CN | 107863351 A | 3/2018 |
| CN | 108093656 A | 5/2018 |
| CN | 108431961 A | 8/2018 |
| CN | 108511449 A | 9/2018 |
| CN | 109196645 A | 1/2019 |
| CN | 109314114 A | 2/2019 |
| CN | 109314117 A | 2/2019 |
| CN | 109417071 A | 3/2019 |
| CN | 109417074 A | 3/2019 |
| KR | 10-2018-0042358 A | 4/2018 |
| TW | 201834207 A | 9/2018 |

OTHER PUBLICATIONS

Written Opinion of the International Searching Authority issued in corresponding International Application No. PCT/CN2019/082460, dated Jan. 16, 2020, 4 pages.
Extended European Search Report issued in corresponding European Application No. 19923837.9, dated Dec. 5, 2022, 12 pages.
Extended European Search Report issued in corresponding European Application No. 19923837.9, dated Sep. 28, 2022, 11 pages.

* cited by examiner

THREE-DIMENSIONAL MEMORY DEVICE WITH DEPOSITED SEMICONDUCTOR PLUGS AND METHODS FOR FORMING THE SAME

CROSS-REFERENCE TO RELATED APPLICATIONS

This application is a continuation of International Application No. PCT/CN2019/082460, filed on Apr. 12, 2019, entitled "THREE-DIMENSIONAL MEMORY DEVICE WITH DEPOSITED SEMICONDUCTOR PLUGS AND METHODS FOR FORMING THE SAME," which is incorporated herein by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with deposited semiconductor plugs and methods for forming the same are disclosed herein.

In one example, a 3D memory device includes a substrate, a memory deck, and a memory string. The memory deck includes a plurality of interleaved conductor layers and dielectric layers on the substrate. The memory string extends vertically through the memory deck. A bottom conductor layer of the plurality of interleaved conductor layers and dielectric layers can intersect with and contact the memory string.

In another example, a 3D memory device includes a substrate, a memory stack, and a memory string. The memory stack includes a plurality of memory decks each having a plurality of interleaved conductor layers and dielectric layers over the substrate. The memory string includes a plurality of memory sub-strings extending vertically through the memory stack, each memory deck having a respective memory sub-string. A bottom conductor layer of the plurality of interleaved conductor layers and dielectric layers may intersect with and contact the memory string.

In still another example, a method for forming a 3D memory device includes the following operations. First, a bottom sacrificial layer is formed over a substrate. A dielectric deck having a plurality of interleaved sacrificial layers and dielectric layers is formed over the bottom sacrificial layer. A memory string is then formed extending through the dielectric deck and the bottom sacrificial layer and contacting the substrate. A support pillar is formed extending through the dielectric deck and the bottom sacrificial layer to contact the substrate. Further, the bottom sacrificial layer is replaced with a bottom dielectric layer between the dielectric deck and the substrate. A source structure is then formed extending through the dielectric deck and into the substrate.

In a further example, a method for forming a 3D memory device includes the following operations. First, a bottom sacrificial layer is formed over a substrate. A first dielectric deck having a plurality of first interleaved sacrificial layers and dielectric layers is formed over the bottom sacrificial layer. A first memory string is formed extending through the first dielectric deck and the bottom sacrificial layer and contacting the substrate. A second dielectric deck having a plurality of second interleaved sacrificial layers and dielectric layers is then formed over the first dielectric deck. A second memory string is formed extending through the second dielectric deck and conductively connecting with the first memory string. The bottom sacrificial layer is replaced with a bottom dielectric layer between the first dielectric deck and the substrate. The plurality of first and second sacrificial layers is then replaced with a plurality of conductors to form a first and a second memory decks. A source structure is formed extending through the first and the second memory decks and into the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2I illustrate cross-section views of an exemplary 3D memory device at various stages of an exemplary fabrication process, according to some embodiments of the present disclosure.

Figure 1:
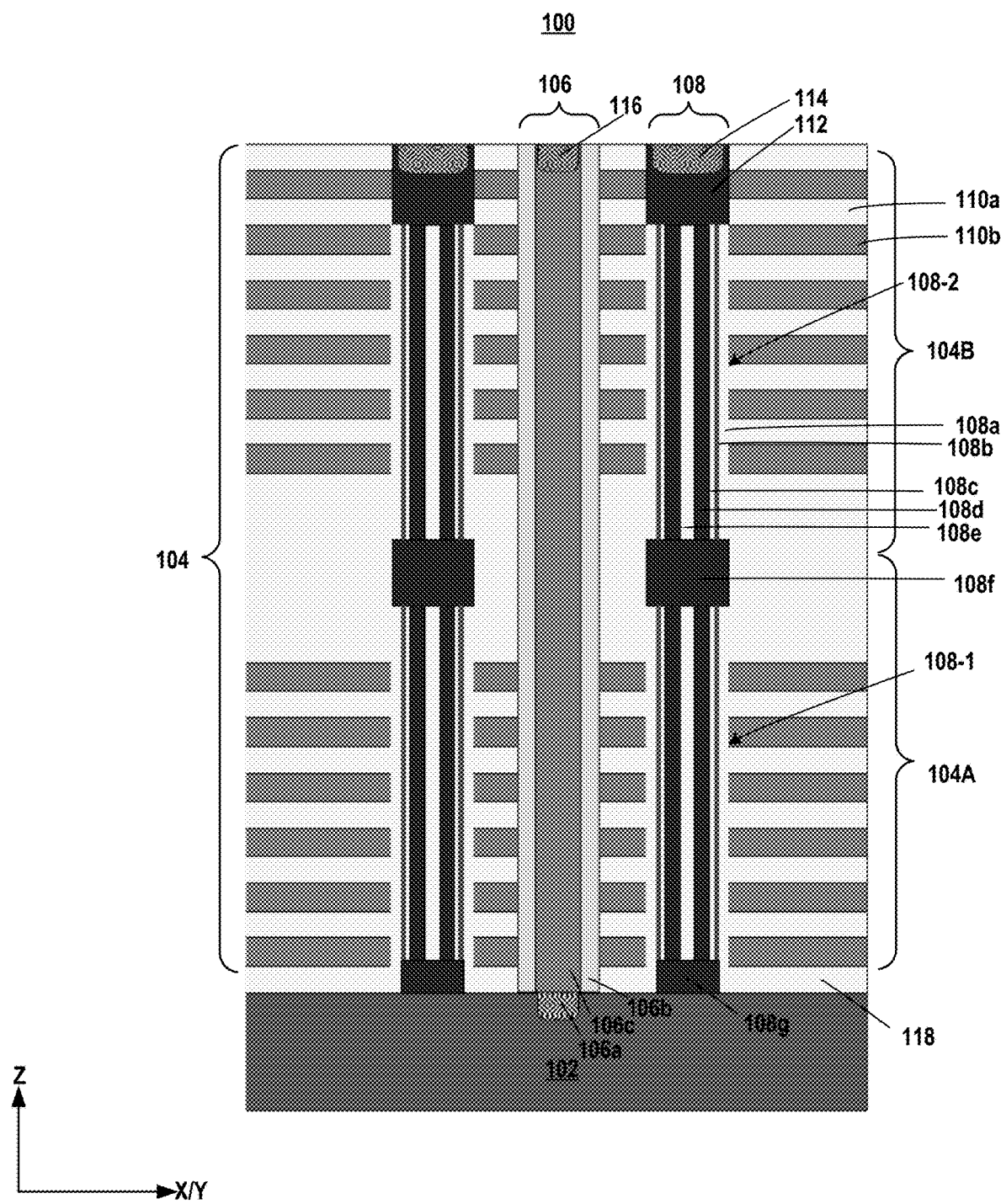
FIG. 1 illustrates a cross-sectional view of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a memory string. The semiconductor plug acts as a channel of a transistor when combined with a gate conductor layer formed surrounding it. In fabricating 3D NAND memory devices with advanced technologies, such as having 96 or more levels, a dual-deck architecture is usually used, which requires removal of a sacrificial layer (e.g., polysilicon) that fills the lower channel hole in the lower deck above the semiconductor plug. The semiconductor plug is often a selective epitaxial growth (SEG) structure formed by epitaxially growing a semiconductor (e.g., silicon) on the substrate at the lower portion of a channel hole. The SEG structure is conductively connected to a semiconductor channel of the memory string and a heavy P-well in the substrate when the memory string is formed. The "erase" operation of a 3D memory device is based on Fowler-Nordheim (FN) tunneling.

The fabrication of SEG structures can cause issues in a 3D memory device. For example, the thicknesses of SEG structures may vary in different memory strings due to factors such as the etching profile of channel holes and growth condition of the SEG structures. The growth of SEG structures can be sensitive to the pattern loading of channel holes and/or support pillar holes. These can cause threshold voltages of the memory strings to vary. Also, the etching of the bottoms of channel holes to expose the substrate before the formation of SEG structures can cause damages to the channel holes and layers deposited on the sidewall of the channel holes. The damage can even exacerbate when the 3D memory device has more than one memory deck stacking together if the semiconductor channels in adjacent memory decks are not precisely aligned. That is, a multi-deck memory device with SEG structures often requires semiconductor channels in adjacent memory decks to have high alignment precision (e.g., small upper-to-lower deck overlay) to avoid or reduce damages to the sidewall of the channel hole during the formation of the SEG structures.

To avoid such issues caused by SEG structures, some 3D memory devices have "SEG-free" structures. In these memory devices, a lower portion of a semiconductor channel is often conductively connected to a source line that is buried between the memory deck and the substrate. The "erase" operation of the 3D memory device is mainly based on gate-induced drain leakage (i.e., GIDL) current induced erase of majority carriers. The mobility of the majority carriers in the semiconductor channel (e.g., holes) can be affected by the minority carriers (e.g., electrons) in the source line, causing the "erase" operation in the memory cells formed by the semiconductor channel to have a slower speed. In a 3D memory device with more than one memory deck stacking together, the speed can be even slower compared to a single stack memory device.

Various embodiments in accordance with the present disclosure provide 3D memory devices without SEGs (i.e., "SEG-free" structures) while maintaining the connection between the memory string and the heavy wells in the substrate. The 3D memory devices of the present disclosure may not have SEG structures at the lower portions of memory strings. Instead, the 3D memory devices include semiconductor plugs formed by depositing a semiconductor material at bottoms of channel holes. To form the semiconductor plugs, a bottom sacrificial layer can be formed between a memory deck and the substrate. Plug openings can be formed in the bottom sacrificial layer to expose the substrate after channel holes are formed. A semiconductor material can be deposited into the plug openings and the remaining of the bottom sacrificial layer can be replaced with a suitable dielectric material. The top surface of the semiconductor plug can be lower than the top surface of the bottom conductor layer of the memory deck, which can contact the semiconductor channel and function as a bottom select gate electrode. The support pillars can be formed separately (e.g., in a separate fabrication process) than the semiconductor channels.

The disclosed structures and methods can have several benefits over existing structures and methods. For example, the bottom dielectric layer, functioning as a bottom select gate dielectric layer, can be formed by transforming the bottom sacrificial layer (e.g., an etch stop layer) into a dielectric layer or replacing the bottom sacrificial layer with a dielectric layer. This can minimize the damage (e.g., caused by the etching of plug openings) to the channel holes during the fabrication of semiconductor plugs, allowing semiconductor plugs of more uniform thicknesses to be formed and thus improving the uniformity of threshold voltages of memory cells. For a 3D memory device with multiple memory decks, the overlay control of the alignment between semiconductor channels of adjacent memory decks can be easier. By using the disclosed structures and methods, semiconductor channels can be connected to the heavy wells in substrate while the "erase" operation can be based on FN tunneling, maintaining the speed of the "erase" operation.

Figure 2A:
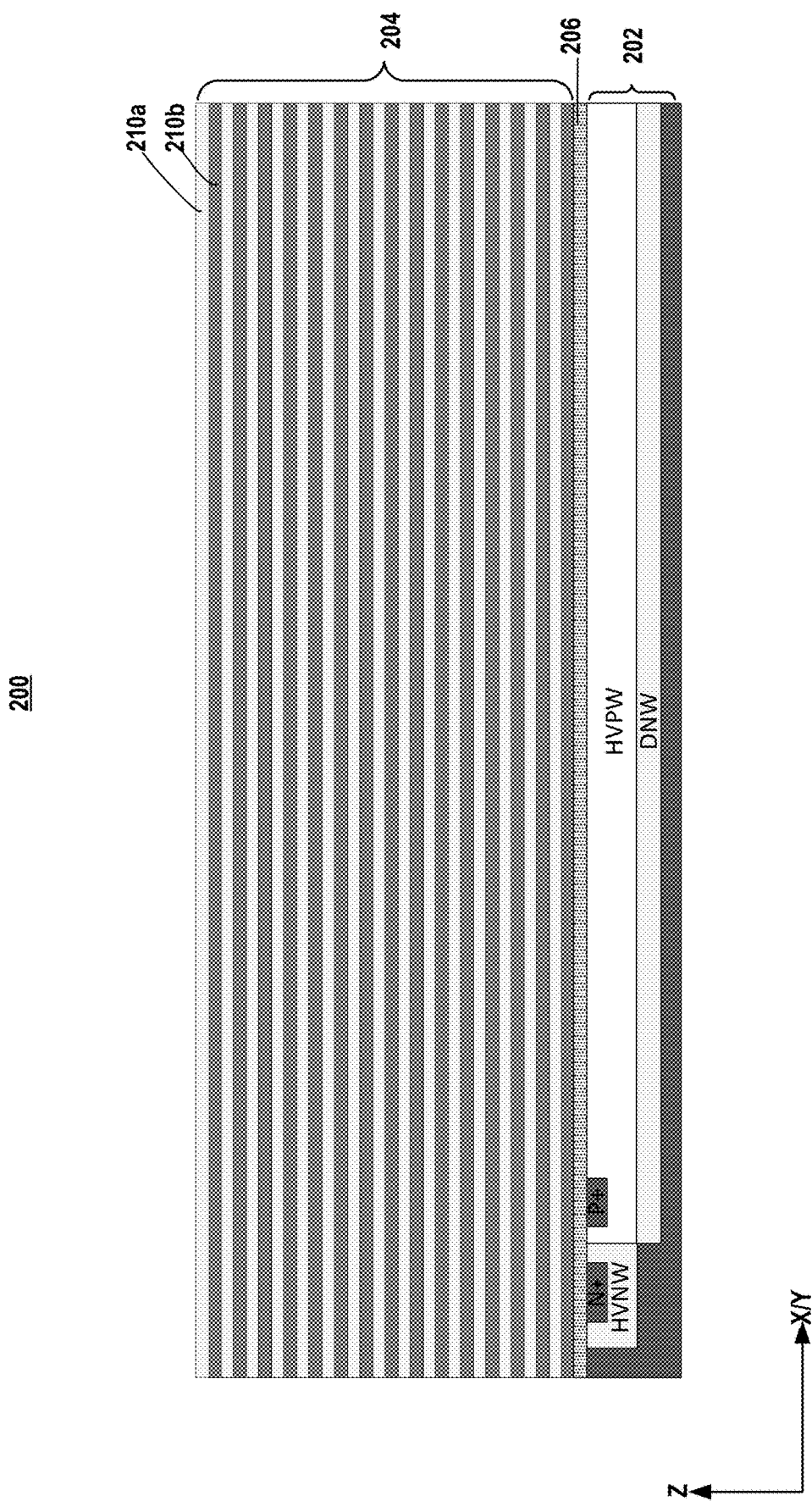
Figure 2B:
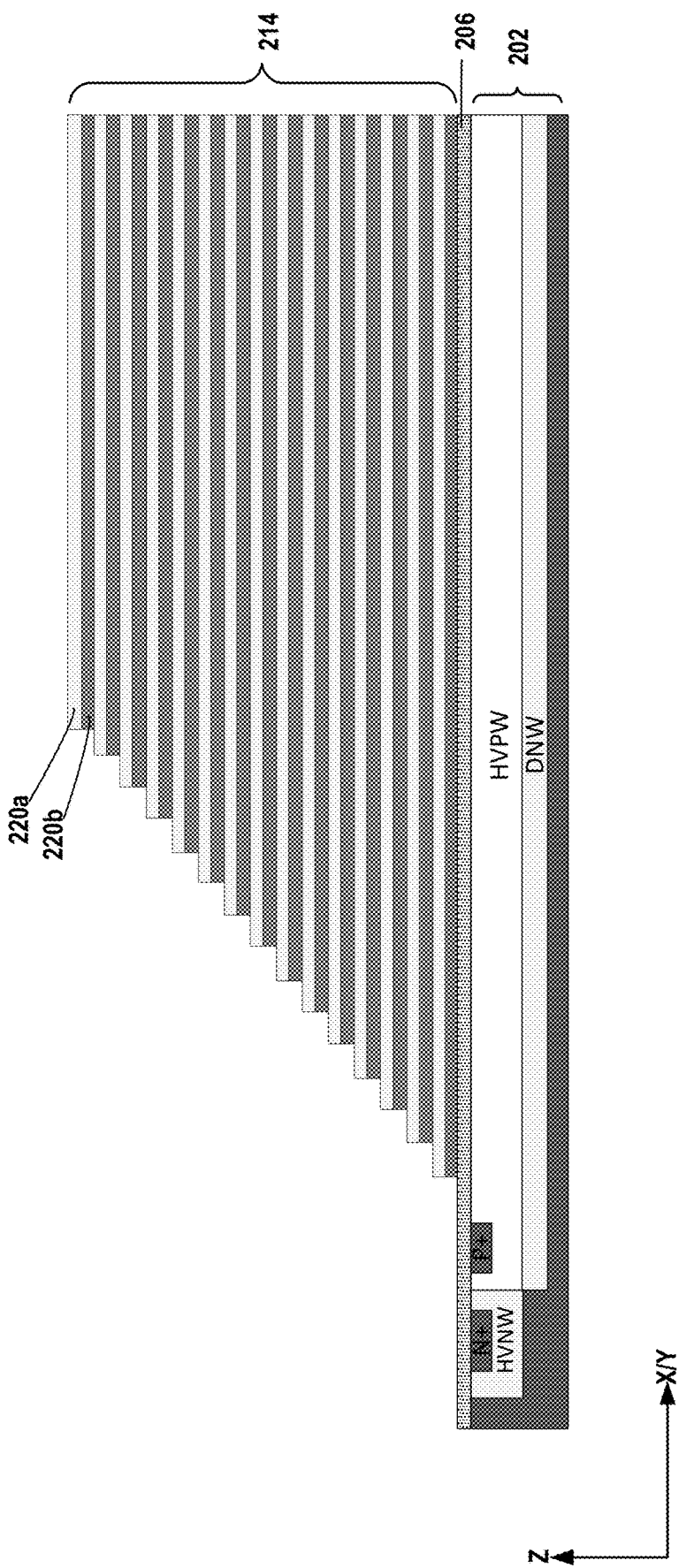
Figure 2C:
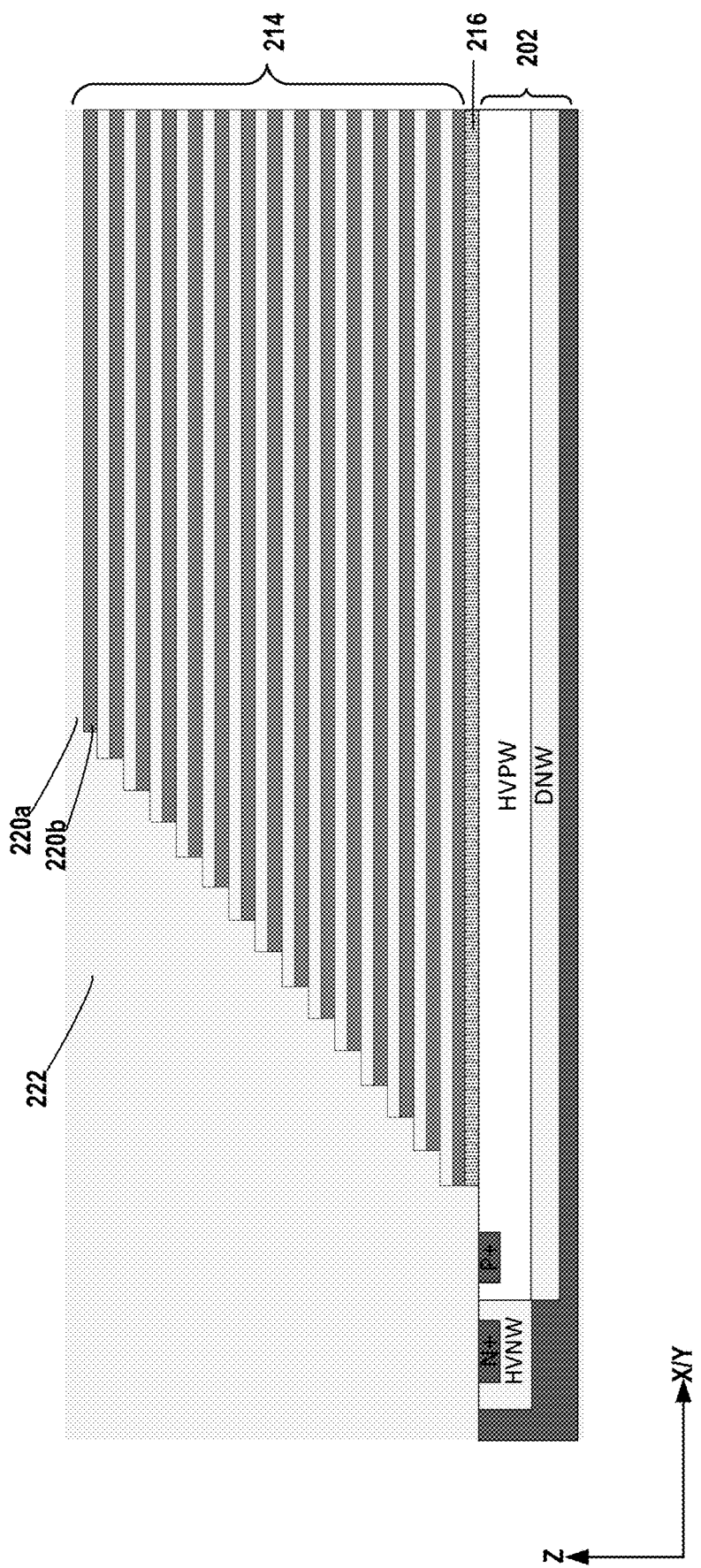
Figure 2D:
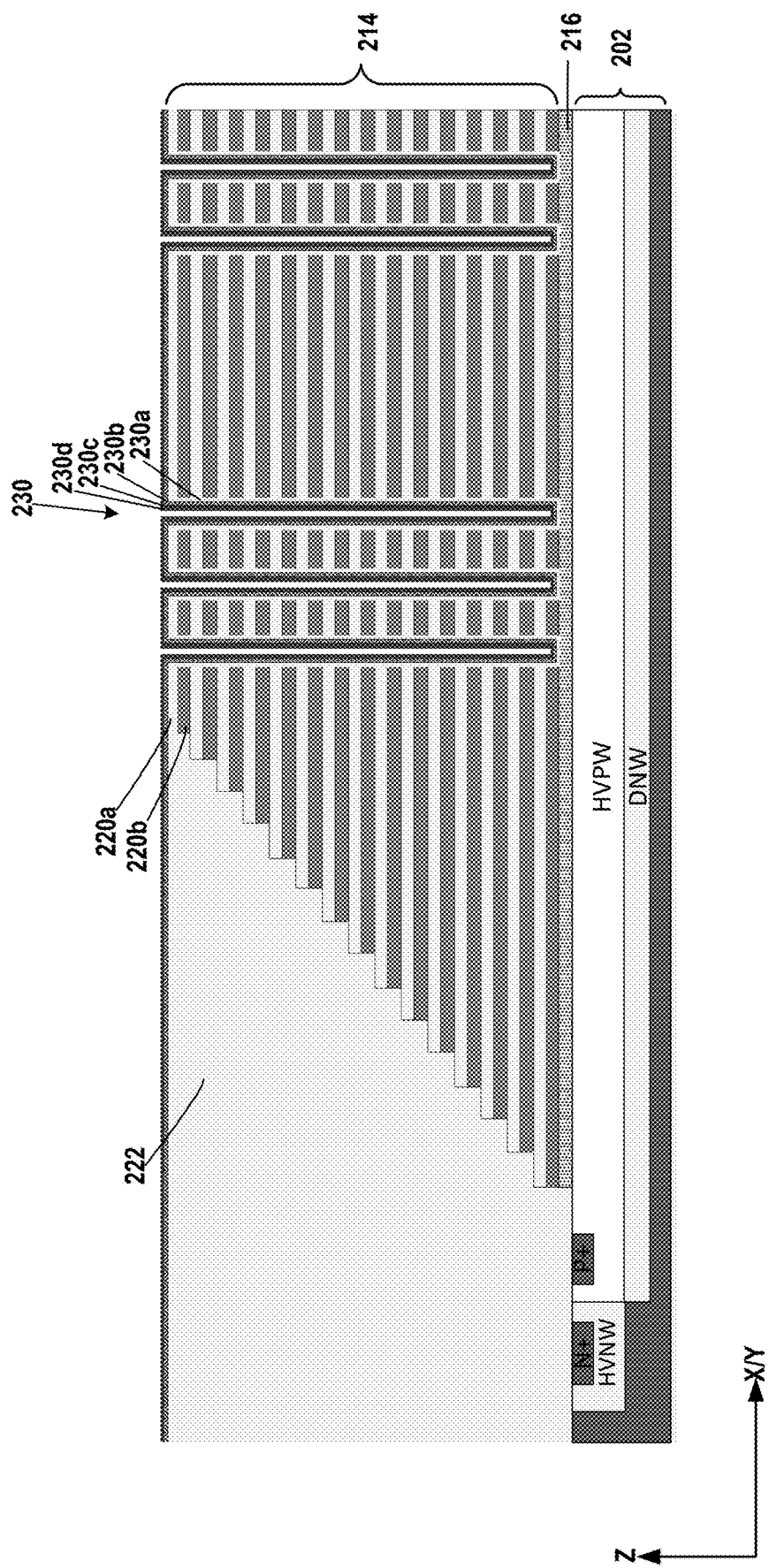
Figure 2E:
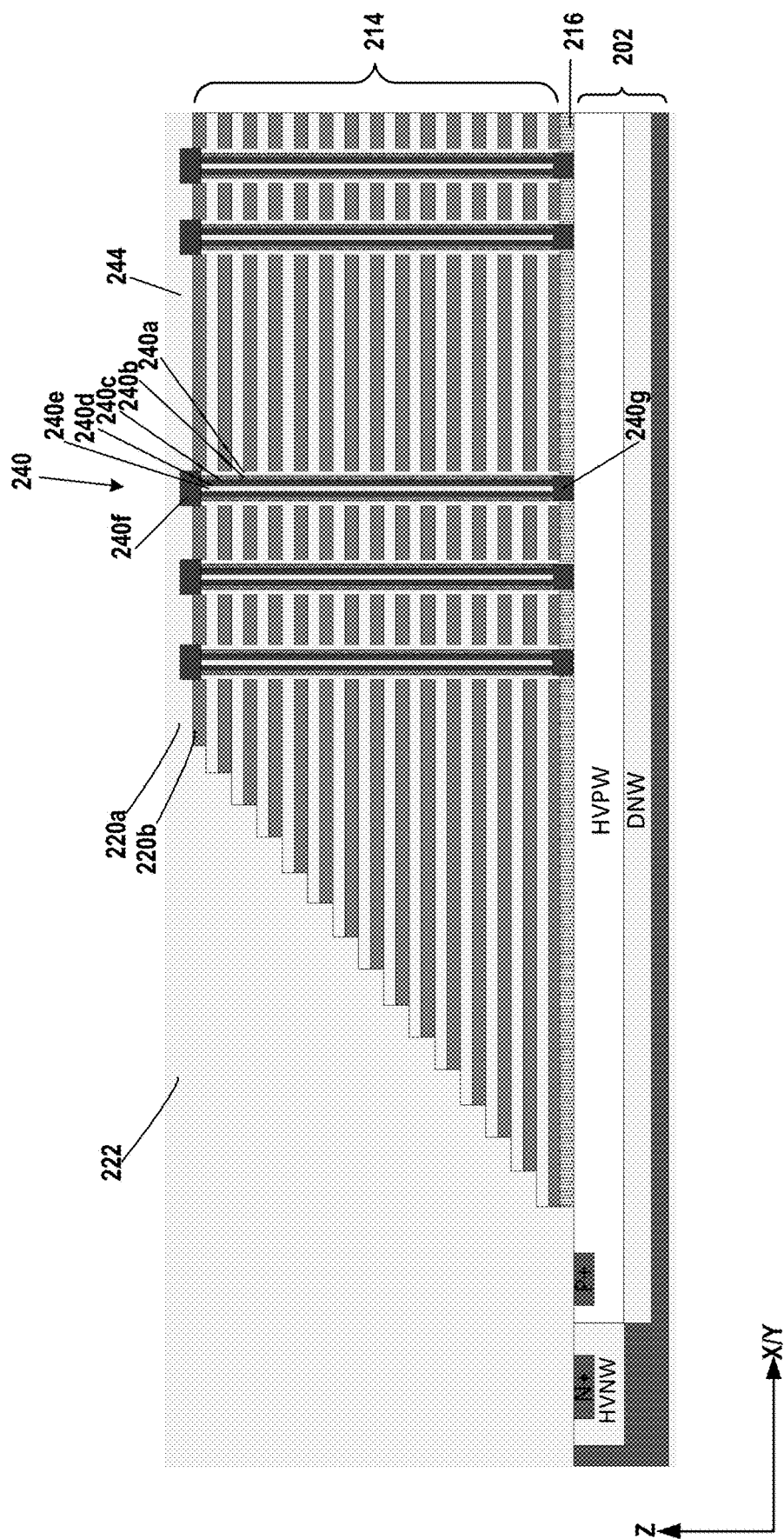
Figure 2F:
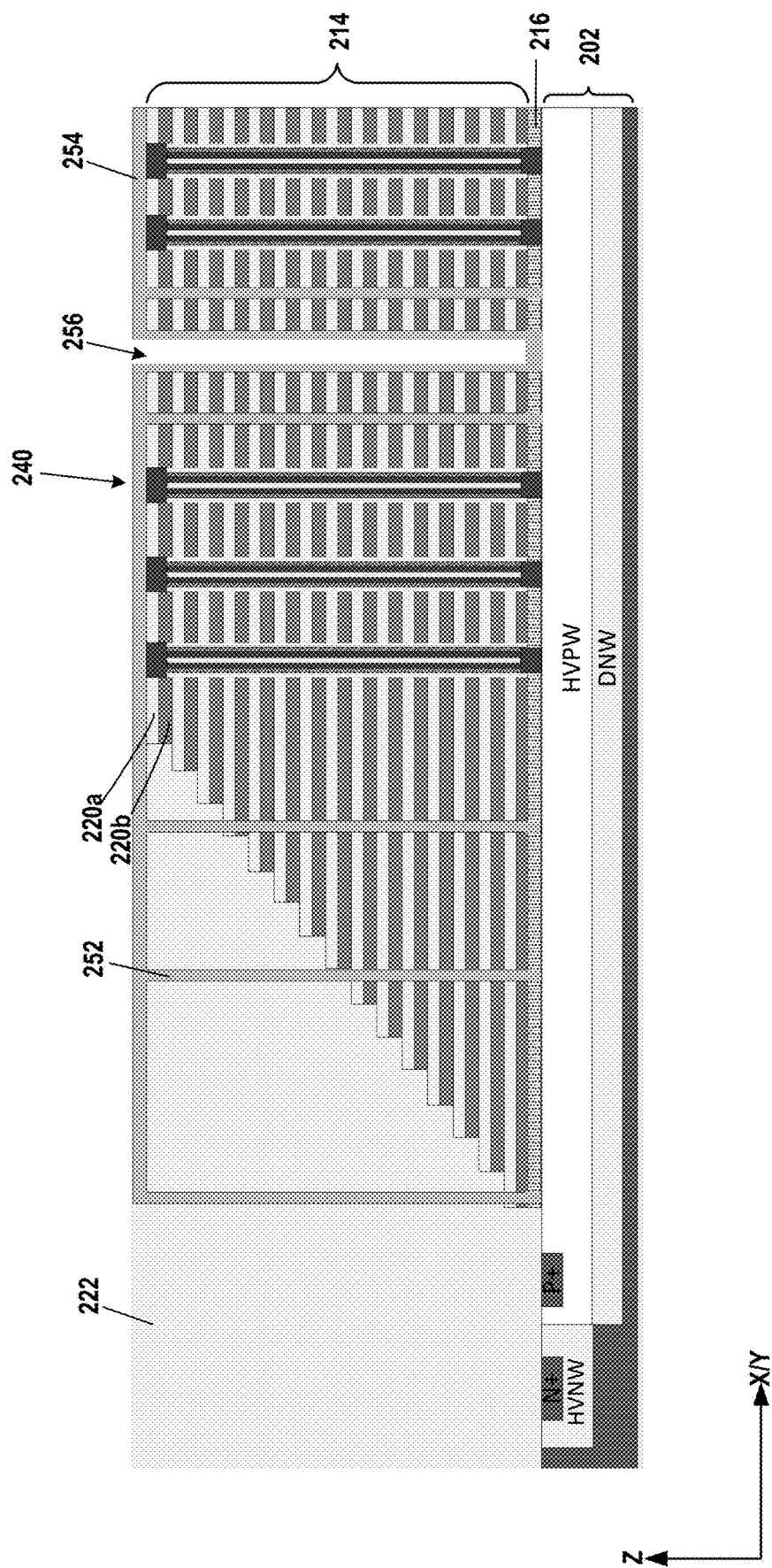
Figure 2G:
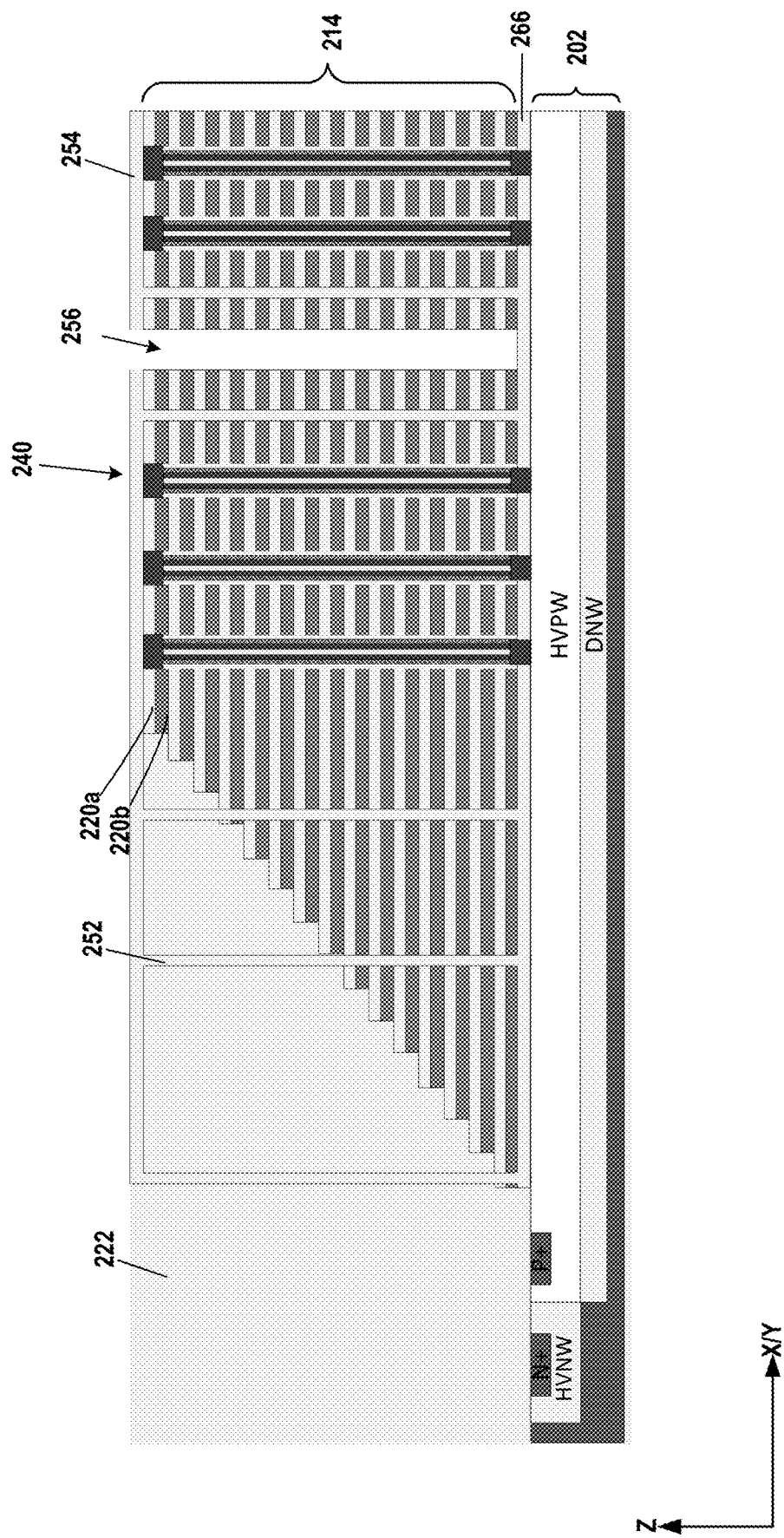
Figure 2H:
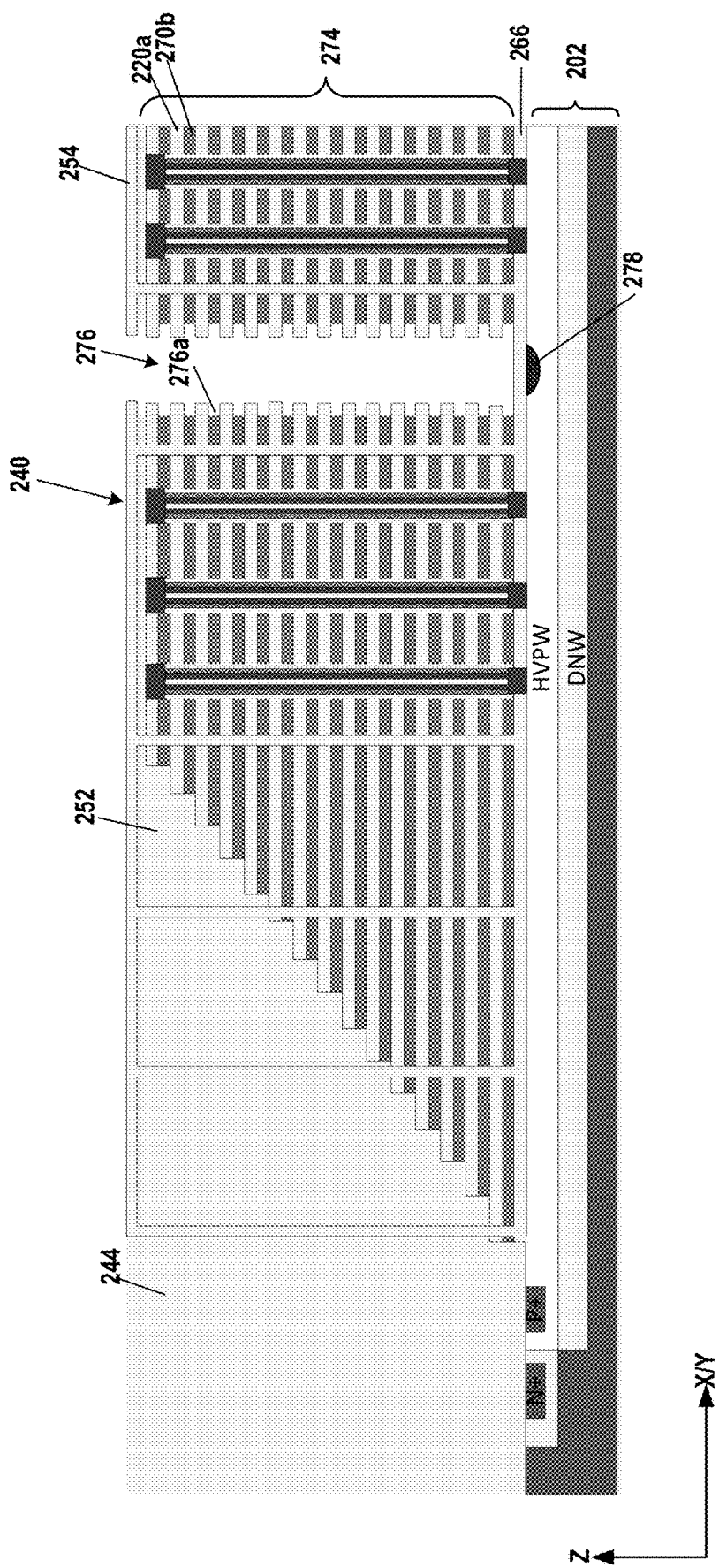
Figure 21:
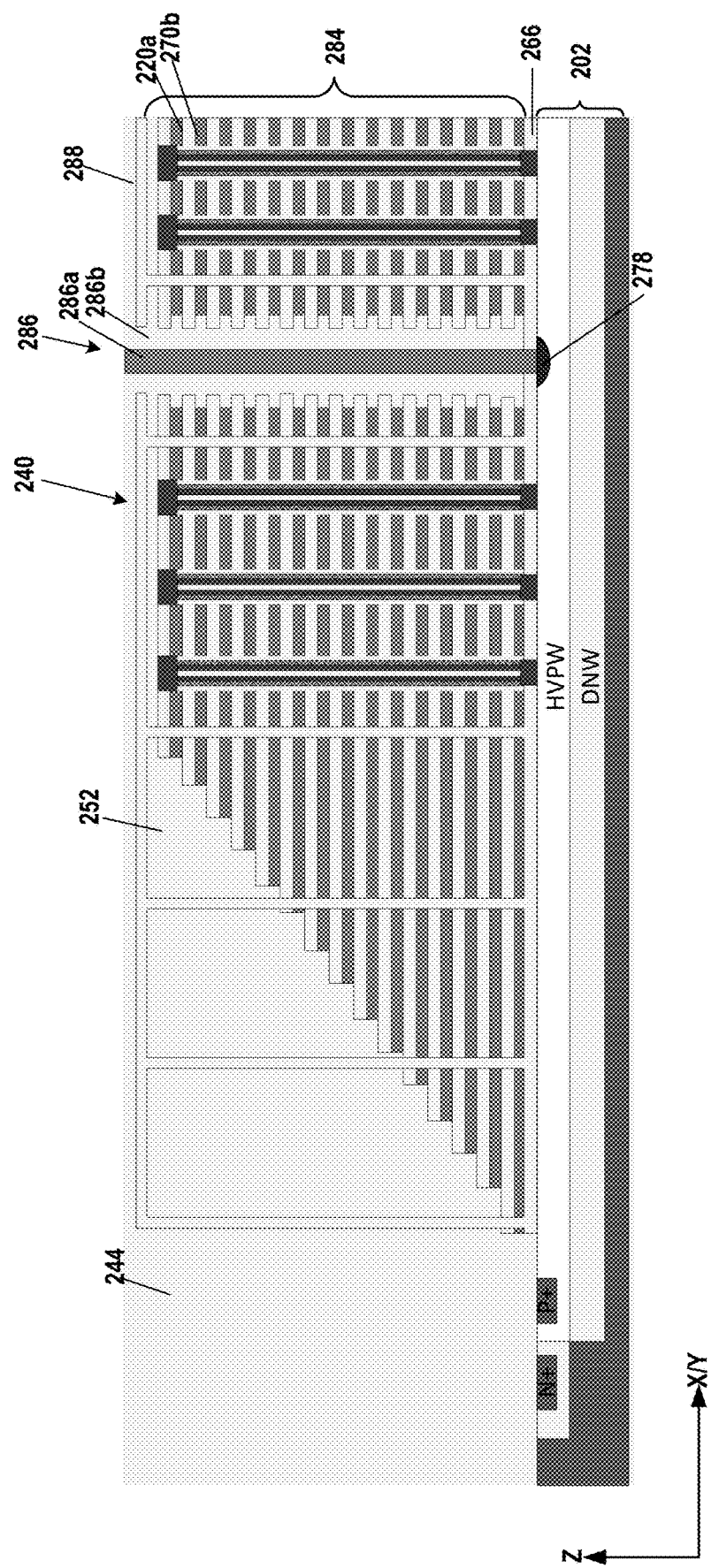
Figure 3:
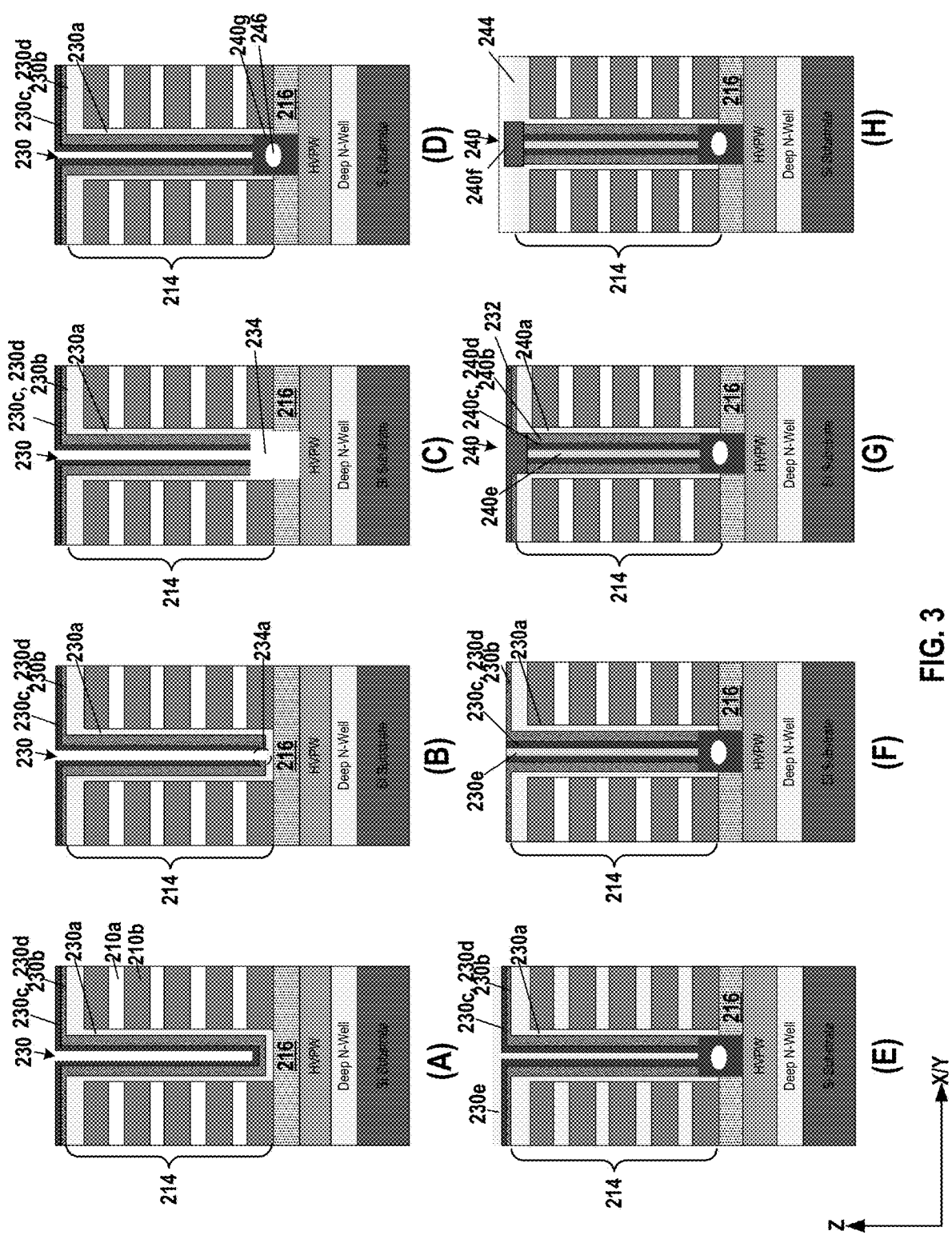
FIG. 3 illustrates an exemplary fabrication process to form a memory string, according to some embodiments of the present disclosure.
Figure 4A:
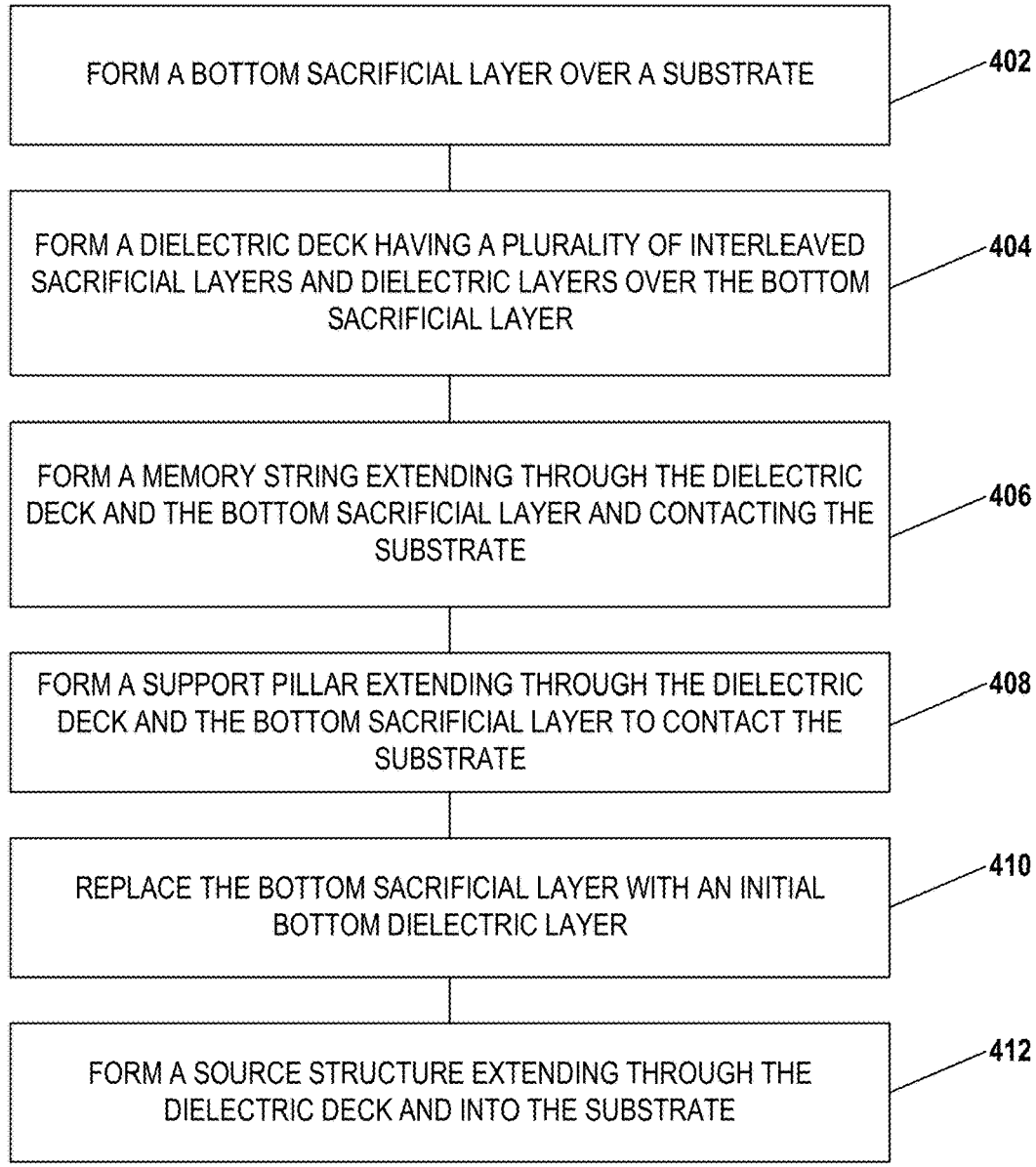
FIGS. 4A-4B each illustrates a flowchart of an exemplary method for forming a 3D memory device, according to some embodiments of the present disclosure.
Figure 4B:
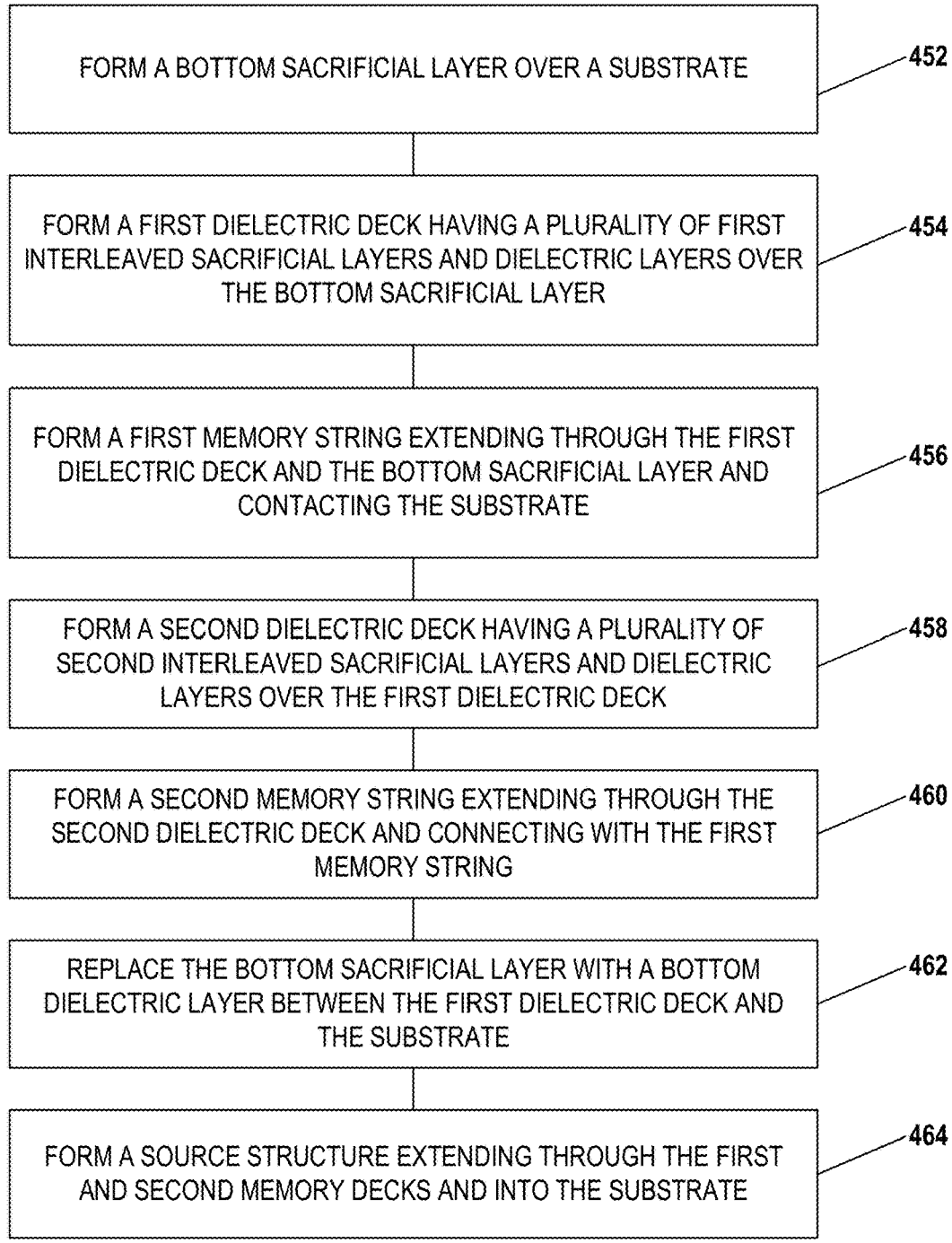

FIG. 1 illustrates a cross-sectional view of a memory device 100 (e.g., a 3D memory device), according to some embodiments of the present disclosure. Memory device 100 may include a memory stack 104, which includes a plurality of memory decks. For ease of illustration, two memory decks 104A and 104B are depicted and described in FIG. 1. FIGS. 2A-2I illustrates a fabrication process of one memory deck (e.g., 104A), according to some embodiments of the present disclosure. FIG. 3 illustrates a fabrication process of a memory string having a semiconductor plug in a memory deck (e.g., 104A), according to some embodiments of the present disclosure. FIG. 4A is a flowchart of the fabrication process illustrated in FIGS. 2A-2I, according to some embodiments of the present disclosure. FIG. 4B illustrates a flowchart of a fabrication process for forming a dual-deck memory device (e.g., memory device 100), according to some embodiments of the present disclosure.

As shown in FIG. 1, memory device 100 includes a substrate 102, a bottom dielectric layer 118 over substrate 102, and memory stack 104 over bottom dielectric layer 118. Memory deck 104 may include two memory decks 104A (e.g., a lower memory deck) and 104B (e.g., an upper memory deck) stacking together along a direction (e.g., the vertical direction or the z-direction) perpendicular to a top surface of substrate 102. Each memory deck (e.g., 104A or 104B) may include a plurality of interleaved dielectric layers 110a and conductor layers 110b extending along a direction (e.g., a lateral direction or the x-y plane) parallel to the top surface of substrate 102. A thickness (e.g., along the vertical direction) of bottom dielectric layer 118 may be about 10 nm to about 50 nm, such as between 20 nm and 50 nm, (e.g., 15 nm, 20 nm, 25 nm, 30 nm, 35 nm, 40 nm, 45 nm, 50 nm, any range bounded by the lower end by any of these values, or in any range defined by any two of these values).

Memory deck 104 may include a plurality of memory strings 108 each extending vertically through memory stack 104 and bottom dielectric layer 118, to connect to substrate 102, which includes a heavy doped region, e.g., a heavy P-well (not shown in FIG. 1) at a top portion of substrate 102, conductively connected to memory strings 108. Memory string 108 may include a plurality of (e.g., two) memory sub-strings (e.g., 108-1 and 108-2), each extending through the respective memory deck (e.g., 104A and 104B). The adjacent memory sub-strings (e.g., 108-1 and 108-2) may be aligned along the vertical direction (e.g., extending direction of memory strings 108) and may be conductively connected by a channel plug 108f, which includes a conductive material such as metal or a doped semiconductor material (e.g., polysilicon). Memory string 108 may include a top channel plug 112 at an upper portion of memory string 108, a top doped region 114 in top channel plug 112, and a semiconductor plug 108g at a lower portion of memory string 108. Top channel plug 112 and top doped region 114 may form conductive connection to other devices/circuits such as peripheral devices. Semiconductor plug 108g may form conductive connection to the heavy doped region in substrate 102. Memory string 108 may include a channel structure that includes a blocking layer 108a, a memory layer 108b, a tunneling layer 108c, a semiconductor layer 108d (e.g., also referred to as a semiconductor channel 108d), and a dielectric core 108e, sequentially arranged from a sidewall to a center of memory string 108. A semiconductor channel (not shown) may be formed in the semiconductor layer, conductively connected to semiconductor plug 108g and top channel plug 112, for carrier transport when memory device 100 is in operation.

Memory deck 104 may also include a source structure 106 extending vertically through memory stack 104 and bottom dielectric layer 118 and into substrate 102. Source structure 106 may include a doped semiconductor region 106a, an insulating structure 106b extending through memory stack 104 and covering conductor layers 110b, and a source conductor 106c extending in insulating structure 106b and being conductively connected to doped semiconductor region 106a. Source structure 106 may also include a source plug 116 in an upper portion of source conductor 106c for conductively connecting to other devices/circuits (e.g., peripheral devices).

Memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., memory strings) is constrained by the thermal budget associated with the peripheral devices that have been formed or to be formed on the same substrate.

Alternatively, memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of memory device 100, such as page buffers, decoders, and latches; not shown) is flipped and faces down toward the memory array device (e.g., memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes a heavy doped region such as a heavy P-well that includes doped silicon, in the upper portion of substrate 102 and contacting memory strings 108.

In some embodiments, memory device 100 is a NAND Flash memory device in which memory cells are provided in the form of an array of memory strings 108 (e.g., memory strings) extending vertically above substrate 102. The memory array device can include memory strings 108 that extend through a plurality of pairs each including a conductor layer 110b and a dielectric layer 110a (referred to herein as "conductor/dielectric layer pairs"). The stacked conductor/dielectric layer pairs are also referred to herein as a "memory deck" 104. The number of the conductor/dielectric layer pairs in memory stack 104 (e.g., 32, 64, 96, or 128) determines the number of memory cells in memory device 100. Memory stack 104 can include a plurality of interleaved conductor layers 110b and dielectric layers 110a. Conductor layers 110b and dielectric layers 110a in memory stack 104 can alternate in the vertical direction. Conductor layers 110b can include conductive materials including, but not limited to, tungsten (W), cobalt (Co), copper (Cu), aluminum (Al), polysilicon, doped silicon, silicides, or any combination thereof. Dielectric layers 110a can include dielectric materials including, but not limited to, silicon oxide, silicon nitride, silicon oxynitride, or any combination thereof. The numbers of conductor/dielectric layer pairs in each of lower and upper memory decks 104A and 104B can be the same or different.

As shown in FIG. 1, memory string 108 can include a channel structure extending vertically through memory stack 104. The channel structure can include a channel hole filled with semiconductor material(s) (e.g., as a semiconductor channel 108d) and dielectric material(s) (e.g., as blocking layer 108a, memory layer 108b, and tunneling layer 108c). In some embodiments, semiconductor channel 108d includes silicon, such as amorphous silicon, polysilicon, or single crystalline silicon. The remaining space of the channel structure can be partially or fully filled with dielectric core 108e including dielectric materials, such as silicon oxide. The channel structure can have a cylinder shape (e.g., a pillar shape). Dielectric core 108e, semiconductor channel 108d, tunneling layer 108c, memory layer 108b, and blocking layer 108a are arranged radially from the center toward the outer surface of the pillar in this order, according to some embodiments. Tunneling layer 108c can include silicon oxide, silicon oxynitride, or any combination thereof. Memory layer 108b can include silicon nitride, silicon oxynitride, silicon, or any combination thereof. Blocking layer 108a can include silicon oxide, silicon oxynitride, high dielectric constant (high-k) dielectrics, or any combination thereof. In one example, tunneling layer 108c/memory layer 108b/blocking layer 108a can include a composite layer of silicon oxide/silicon oxynitride/silicon oxide (ONO).

In some embodiments, conductor layer 110b (each being part of a word line) in memory stack 104 functions as a gate conductor of memory cells in memory string 108. Conductor layer 110b can include multiple control gates of multiple memory cells and can extend laterally as a word line ending at the edge of memory stack 104 (e.g., in a staircase structure of memory stack 104). In some embodiments, memory cell transistors in memory string 108 include gate conductors (i.e., parts of conductor layers 110b that abut the channel structure) made from W, adhesion layers (not shown) including titanium/titanium nitride (Ti/TiN) or tantalum/tantalum nitride (Ta/TaN), gate dielectric layers (not shown) made from high-k dielectric materials, and the channel structure including polysilicon. In some embodiments, bottom conductor layer 110b (e.g., conductor layer 110b that is closest to substrate 102) may function as a bottom select gate and may intersect and contact the channel structure (e.g., memory string 108).

In some embodiments, memory string 108 further includes semiconductor plug 108g in a lower portion (e.g., at the lower end) of memory string 108. As used herein, the "upper end" of a component (e.g., memory string 108) is the end farther away from substrate 102 in the y-direction, and the "lower end" of the component (e.g., memory string 108) is the end closer to substrate 102 in the y-direction when substrate 102 is positioned in the lowest plane of memory device 100. Semiconductor plug 108g can include a semiconductor material, such as polysilicon, which is deposited on substrate 102 in any suitable directions. It is understood that in some embodiments, semiconductor plug 108g includes amorphous silicon. In some embodiments, the top surface of semiconductor plug 108g is lower, e.g., along the vertical direction, than the top surface of bottom conductor layer 110b. Semiconductor plug 108g can function as a channel controlled by a source select gate of memory string 108. In some embodiments, conductor layers 110b (e.g., bottom conductor layer 110b) intersect and contact memory string 108.

In some embodiments, memory string 108 further includes a top channel plug 112 in an upper portion (e.g., at the upper end) of memory string 108. Top channel plug 112 can be in contact with the upper end of semiconductor channel 108d. Top channel plug 112 can include semiconductor materials (e.g., polysilicon) or conductive materials (e.g., metals). In some embodiments, top channel plug 112 includes an opening filled with Ti/TiN or Ta/TaN as an adhesion layer and tungsten as a conductor. By covering the upper end of the channel structure during the fabrication of memory device 100, top channel plug 112 can function as an etch stop layer to prevent etching of dielectrics filled in the channel structure, such as silicon oxide and silicon nitride. In some embodiments, top channel plug 112 also functions as the drain of memory string 108. In some embodiments, when top channel plug 112 includes polysilicon, a top doped region 114 is formed in top channel plug 112 to increase conductivity.

As shown in FIG. 1, source structure 106 may extend vertically through memory stack 104 and be conductively connected to substrate 102. Doped semiconductor region 106a may be conductively connected to a heavy doped region/well (e.g., a heavy P-well in substrate 102, not shown) so source conductor 106c can be conductively connected to memory strings 108. Source conductor 106c can include any suitable conductive material such as W, Co, Al, Cu, polysilicon, and/or silicide. Insulating structure 106b can include any suitable dielectric materials such as silicon oxide. In some embodiments, when source conductor 106c includes polysilicon, source plug 116 (e.g., a doped region) is formed in the upper portion of source conductor 106c to increase conductivity of source conductor 106c with other devices/circuits.

FIGS. 2A-2I illustrate an exemplary fabrication process to form a lower memory deck, and FIG. 3 illustrates an exemplary fabrication process to form a memory string with a "SEG-free" semiconductor plug in structures depicted in FIGS. 2A-2I. FIG. 4A illustrates a flowchart of an exemplary method 400 for forming the lower memory deck. FIG. 4B illustrates a flowchart of an exemplary method 450 for forming memory device 100. The fabrication processes are now described in view of the structures shown in FIGS. 2A-2I and 3. It is understood that the operations shown in methods 400 and 450 are not exhaustive and that other operations can be performed as well before, after, or between any of the illustrated operations. Further, some of the operations may be performed simultaneously, or in a different order than shown in FIGS. 2A-2I, 3, 4A and 4B.

As shown in FIG. 4A, at the beginning of the process, a bottom sacrificial layer is formed over a substrate and a dielectric deck is formed over the bottom sacrificial layer. The dielectric deck includes a plurality of interleaved sacrificial layers and dielectric layers (Operations 402 and 404). FIGS. 2A-2C illustrate corresponding structures.

As shown in FIG. 2A, an initial bottom sacrificial layer 206 may be formed over a substrate 202, and an initial dielectric deck 204 may be formed over initial bottom sacrificial layer 206. In some embodiments, substrate 202 can be a silicon substrate that includes a plurality of doped wells such at the upper portion of substrate 202. For example, the doped wells can include a heavy P-well (HVPW), a deep N-well (DNW), and a heavy N-well (HVNW), as shown in FIG. 2A. In some embodiments, the HVPW is located under the subsequently-formed memory strings formed in the dielectric deck. In some embodiments, the doped wells can be formed by respective ion implantation processes on substrate 202.

In some embodiments, initial bottom sacrificial layer 206 includes a suitable material different from the material of the sacrificial layers of initial dielectric deck 204. The material of initial bottom sacrificial layer 206 may have sufficiently high etching selectivity over initial dielectric deck 204. In some embodiments, initial bottom sacrificial layer 206 functions as an etch stop layer to stop the etching of initial dielectric deck 204. In some embodiments, initial bottom sacrificial layer 206 includes one or more of W, Co, Al, and Cu. Initial bottom sacrificial layer 206 may be formed by any suitable deposition process such as sputtering, electron beam evaporation, chemical vapor deposition (CVD), and/or physical vapor deposition (PVD). Optionally, initial bottom sacrificial layer 206 can be planarized (e.g., by recess etch and/or chemical mechanical polishing (CMP)) to ensure desirable flatness for initial dielectric deck 204 to be formed thereon.

Initial dielectric deck 204 can include a first plurality of interleaved initial dielectric layers 210a and initial sacrificial layers 210b. An initial sacrificial layer 210b and its respective initial dielectric layer 210a (e.g., dielectric layer 210a over or under it) can together be referred to herein as an "initial dielectric layer pair." Initial dielectric layers 210a and initial sacrificial layers 210b can be alternatively deposited on initial bottom sacrificial layer 206 to form initial dielectric deck 204. In some embodiments, each initial dielectric layer 210a includes a layer of silicon oxide, and each initial sacrificial layer 210b includes a layer of silicon nitride. In some embodiments, each initial dielectric layer 210a and each initial sacrificial layer 210b have nominally the same thicknesses along the vertical direction. The thickness of initial bottom sacrificial layer 206 may be similar to or in a similar range (e.g., between 10 nm and 70 nm). In some embodiments, the thicknesses of initial dielectric layer 210a, initial sacrificial layer 210b, and initial bottom sacrificial layer 206 may have nominally the same thickness. Initial dielectric deck 204 can be formed by one or more thin film deposition processes including, but not limited to, CVD, PVD, atomic layer deposition (ALD), or any combination thereof. In some embodiments, initial bottom sacrificial layer 206 and initial dielectric deck 204 covers the area of the HVPW on substrate 202.

As shown in FIG. 2B, a dielectric deck 214 can be formed over initial bottom sacrificial layer 206. Dielectric deck 214 can be formed by, e.g., repetitively etching the initial dielectric layer pairs along the vertical direction and lateral directions. In some embodiments, an etch mask, e.g., a photoresist layer (not shown), can be patterned over the top surface of initial dielectric deck 204. The etch mask can be repetitively trimmed (e.g., etched) laterally (e.g., along various directions parallel to the lateral/x-y plane) and vertically to expose portions of initial dielectric deck 204. A suitable isotropic etching process (e.g., a wet etch) may be performed to repetitively remove the exposed portions of initial dielectric deck 204 along various directions. In some embodiments, initial bottom sacrificial layer 206 functions as an etch stop layer such that the etching rate of initial dielectric deck 204 is sufficiently higher than the etching rate of initial bottom sacrificial layer 206. When the etching of initial dielectric deck 204 is completed, dielectric deck 214 may be formed over initial bottom sacrificial layer 206. In some embodiments, dielectric deck 214 includes a staircase structure. Initial dielectric layer pairs can be etched to form dielectric layer pairs that each includes a dielectric layer 220a and a sacrificial layer 220b.

As shown in FIG. 2C, the portion of initial bottom sacrificial layer 206 exposed by dielectric deck 214 may be removed to form bottom sacrificial layer 216 and expose substrate 202. The removal of the exposed portion of initial bottom sacrificial layer 206 can include any suitable etching process such as a wet etch or wet clean process. A dielectric filling material can then be deposited over substrate 202 and dielectric deck 214 and planarized to form a dielectric filling structure 222.

Referring back to FIG. 4A, a memory string is formed. The memory string extends through the dielectric deck and the bottom sacrificial layer, and contacts the substrate (Operation 406). FIGS. 2D and 2E illustrate corresponding structures.

As shown in FIG. 2D, a plurality of openings 230 (e.g., channel holes) can be formed to extend through dielectric deck 214 to expose bottom sacrificial layer 216, and a layer of a blocking material 230*a*, a layer of a memory material 230*b*, a layer of a tunneling material 230*c*, and a layer of a semiconductor material 230*d* can be sequentially deposited over a sidewall of opening 230. Because bottom sacrificial layer 216 functions as an etch stop layer, a bottom surface of opening 230 may expose bottom sacrificial layer 216. Opening 230 may be formed by a suitable etching process using a patterned etch mask that exposes areas corresponding to opening 230 over dielectric deck 214. In some embodiments, the etching process includes dry etch. Any suitable deposition processes, e.g., CVD, PVD, ALD, and/or sputtering, can be performed to deposit the layers of blocking material 230*a*, memory material 230*b*, tunneling material 230*c*, and semiconductor material 230*d*.

As shown in FIG. 2E, a memory string 240 can be formed from an opening 230 and channel-forming layers (e.g., 230*a*, 230*b*, 230*c*, and 230*d*) deposited in opening 230. Memory string 240 may include a blocking layer 240*a*, a memory layer 240*b*, a tunneling layer 240*c*, a semiconductor layer 240*d*, and a dielectric core 240*e* arranged sequentially from the sidewall to the center of opening 230. Memory string 240 may also include a channel plug 240*f* over and conductively connected to these layers, and a semiconductor plug 240*g* at the bottom of memory string 240, conductively connected to these layers and substrate 202. In some embodiments, memory string 240 is similar to or the same as memory sub-string 108-1. The fabrication process of memory string 240 is described in detail as follows in view of FIG. 3.

Referring back to FIG. 4A, a support pillar is formed. The support pillar extends through the dielectric deck and the bottom sacrificial layer to contact the substrate (Operation 408). FIGS. 2F and 2G illustrate corresponding structures.

As shown in FIG. 2F, a plurality of support pillars 252 are formed to extend through dielectric deck 214, dielectric filling structure 222 and bottom dielectric layer 216, to contact substrate 202. A support pillar 252 includes a pillar hole that extends through dielectric deck 214, dielectric filling structure 222, and bottom dielectric layer 216 to expose substrate 202, and a pillar material (e.g., a dielectric material such as silicon oxide) filled in the pillar hole. In some embodiments, a lateral dimension (e.g., diameter) of support pillar 252 is less than a lateral dimension (e.g., diameter) of memory string 240. Support pillars 252 can be formed by performing a suitable etching process (e.g., a dry etch) using a patterned etch mask that exposes areas corresponding to the pillar holes. In some embodiments, an initial slit structure 256 is formed by the same etching process that forms the pillar holes. Initial slit structure 256 may extend through dielectric deck 214, dielectric filling structure 222 and bottom dielectric layer 216 to expose substrate 202. A suitable dielectric material can be deposited to fill up the pillar holes with any suitable deposition process such as CVD, PVD, and/or ALD. A layer of the pillar-filling dielectric material 254 can be deposited over a bottom surface and a sidewall of initial slit structure 256 and on dielectric deck 214.

Referring back to FIG. 4A, the bottom sacrificial layer is replaced with an initial bottom dielectric layer that is between the dielectric deck and the substrate (Operation 410). FIG. 2G illustrates a corresponding structure.

As shown in FIG. 2G, the portions of pillar-filling dielectric material 254 on the sidewall and on the bottom surface of initial slit structure 256 can be removed to expose substrate 202 and the remaining portion of bottom dielectric layer 216 (i.e., the portion of bottom dielectric layer 216 retained from the formation of initial slit structure 256). The remaining portion of bottom dielectric layer 216 can then be removed. An initial bottom dielectric layer 266 can be formed between dielectric deck 214 and substrate 202. In some embodiments, initial bottom dielectric layer 266 fills up the space between dielectric deck 214 and substrate 202, and forms a layer at the bottom of initial slit structure 256.

The portions of pillar-filling dielectric material 254 on the sidewall and bottom surface of initial slit structure 256 can be removed by covering the top surface of dielectric deck 214 with a protective layer and perform a suitable etching process to remove the portions of pillar-filling dielectric material 254 on the sidewall and bottom surface of initial slit structure 256. In some embodiments, the protective layer includes polymer, and the etching process includes a dry etch.

A suitable wet etch can be performed to remove bottom sacrificial layer 216. In some embodiments, the wet etch has sufficiently high etching selectivity of bottom sacrificial layer 216 over dielectric deck 214 and support pillars 252 so that little or no damage is formed on the sidewall of initial slit structure 256 (or dielectric deck 214). In some embodiments, support pillars 252 remain through dielectric filling structure 222 and dielectric deck 214 to substrate 202 after bottom sacrificial layer 216 is removed. That is, support pillars 252 may support dielectric deck 214 on substrate 202 during and after the etching of bottom sacrificial layer 216.

After bottom sacrificial layer 216 is removed, an initial bottom dielectric layer 266 is formed between dielectric deck 214 and substrate 202. Initial bottom dielectric layer 266 can be formed in a suitable process such as one or more of a "native oxide" method, an "in-situ steam generated (ISSG) oxidation" method, and a silane oxidation method. In some embodiments, the native oxide method includes an oxidation process involving oxygen gas and substrate 202 to form a native oxide (e.g., silicon oxide) of substrate 202 along the vertical direction until the space formed by the removal of bottom sacrificial layer 216 is filled with the native oxide. In some embodiments, the ISSG oxidation method includes a thermal oxidation process involving reactant gases of hydrogen, oxygen, and substrate 202 to form silicon oxide along the vertical direction until the space formed by the removal of bottom sacrificial layer 216. In some embodiments, the silane oxidation method includes a thermal oxidation process involving reactant gases of silane (SiH4) and oxygen to form silicon oxide along the vertical direction until the space formed by the removal of bottom sacrificial layer 216. In some embodiments, initial bottom dielectric layer 266 may extend along the top surface of substrate 202 and under dielectric deck 214.

Referring back to FIG. 4A, a source structure is formed to extend through the dielectric deck and into the substrate (Operation 412). FIGS. 2H and 2I illustrate corresponding structures.

As shown in FIG. 2H, an initial memory deck 274 can be formed. Initial memory deck 274 may include a slit structure 276 extending through initial memory deck 274 and exposing initial bottom dielectric layer 266, a plurality of recessed conductor layers 270*b* extending laterally on the sidewall of slit structure 276, and a doped semiconductor region 278 in the portion of HVPW that is under slit structure 276. In some embodiments, sacrificial layers 220*b* of dielectric deck 214 are replaced with a plurality of conductor layers extending laterally, and a slit structure 276 may be formed by performing a recess etch on the conductor layers exposed in initial slit structure 256. In some embodiments, a suitable etching process (e.g., a wet etch) is performed to remove sacrificial layers 220b to form a plurality of lateral recesses on the sidewall of initial slit structure 256, and a suitable deposition process (e.g., CVD, PVD, ALD, and/or sputtering) is performed to deposit a conductive material to fill up the lateral recesses and form a plurality of conductor layers. The conductor layers can include one or more of W, Co, Al, and Cu. In some embodiments, an adhesive layer including Ti and/or TiN can be formed prior to the deposition of the conductor layers between adjacent dielectric layers 220a to increase the adhesion between the conductor layers and adjacent dielectric layers 220b. The recess etch can be performed on the conductor layers to form the plurality of recessed conductor layers 270b.

A plurality of recessed conductor layers 270b and a plurality of recesses 276a abutting the sidewall of slit structure 276 are formed by etching parts of the conductor layers of dielectric deck 214 that abut the sidewall of initial slit structure 256. In some embodiments, recesses 276a are formed by applying etchants to the conductor layers through initial slit structure 256 to completely remove part of the conductor layers along the sidewall of initial slit structure 256 and further etch parts of the conductor layers in the lateral recesses. Recessed conductor layers 270b, slit structure 276, and initial memory deck 274 can be formed. The dimension of recess 276a can be controlled by the etching rate (e.g., based on the etchant temperature and concentration) and/or etching time. Recessed conductor layers 270b can subsequently function as the gate lines of memory device 200.

Doped semiconductor region 278 can be formed by performing an ion implantation process on the portion of initial bottom dielectric layer 266 exposed by slit structure 276 before or after the formation of recessed conductor layers 270b. Doped semiconductor region 278 can subsequently function as a common source of the surrounded memory strings 240. Doped semiconductor region 278 may be conductively connected to the surrounded memory strings 240 through the HVPW.

As shown in FIG. 2I, a source structure 286 is formed in slit structure 276 and a memory deck 284 can be formed. Source structure 286 may include an insulating structure 286b (e.g., a spacer) along a sidewall of slit structure 276 to cover recessed conductor layers 270b and electrically separate recessed conductor layers 270b of the memory stack. In some embodiments, insulating structure 286b includes a dielectric material is formed along the sidewall of slit structure 276 and in recesses 276a using one or more thin film deposition processes, such as ALD, CVD, PVD, any other suitable processes, or any combination thereof. Insulating structure 286b can include a single or composite layer of dielectric materials, such as silicon oxide and silicon nitride. By covering the sidewall of slit structure 276 as well as filling in recesses 276a with insulating structure 286b, recessed conductor layers 270b (e.g., gate lines) of memory deck 284 can be electrically separated by insulating structures 286b.

A source contact 286a is formed in insulating structure 286b and through initial bottom dielectric layer 266 in slit structure 276. Source contact 286a may be in contact with doped semiconductor region 278 and may be conductively connected to the surrounded memory strings 240 through doped semiconductor region 278. A suitable etching process (e.g., dry etch) can be performed to remove a portion of initial bottom dielectric layer 266 to expose doped semiconductor region 278. Source contact 286a can be formed by depositing a suitable conductive material over insulating structure 286b. The conductive materials may include, but not limited to, W, Co, Cu, Al, polysilicon, silicides, or any combination thereof, using one or more thin film deposition processes, such as ALD, CVD, PVD, any other suitable processes, or any combination thereof. Source contact 286a can act as an array common source (ACS) contact electrically connected to the channel structures of surrounded memory strings 240. Source structure 286 including insulating structure 286b and source contact 286a can thereby be formed in slit structure 276, surrounded by a plurality of memory strings 240. In some embodiments, a planarization process (e.g., CMP and/or recess etch) can be performed to remove any excessive conductive material that forms source contact 286a and/or dielectric material that forms insulating structure 286b. An insulating cap layer 288 can be formed over memory deck 284. In some embodiments, insulating cap layer 288 provides the base for other devices/structures (e.g., another memory deck) to be formed over memory deck 284.

FIG. 3 illustrates operations A-H for forming a memory string 240 with a semiconductor plug 240g, according to some embodiments. For ease of illustration, layers of tunneling material and semiconductor material, i.e., 230c and 230d, are shown as one single layer in operations A-E, and tunneling layer 240c and semiconductor layer 240d are shown as one single layer in operations F-H. In some embodiments, a layer of semiconductor material 230d is deposited over layer of tunneling material 230c, and semiconductor layer 240d is over tunneling layer 240c.

As shown in FIG. 3, in operation A, channel-forming layers, e.g., a layer of a blocking material 230a, a layer of a memory material 230b, a layer of a tunneling material 230c, and a layer of a semiconductor material 230d may be sequentially deposited over the sidewall of opening 230 in dielectric deck 214. In operation B, an initial plug opening 234a may be formed through layers of blocking material, memory material, tunneling material, and semiconductor material (i.e., 230a, 230b, 230c, and 230d) to expose bottom sacrificial layer 216. A suitable dry etching process can be performed to remove portions of the channel-forming layers. In operation C, a plug opening 234 can be formed. Plug opening 234 can be formed by enlarging or expanding initial plug opening 234a to vertically and laterally remove materials surrounding initial plug opening 234a. Plug opening 234 can be through bottom sacrificial layer 216 and can expose the HVPW under bottom sacrificial layer 216. In some embodiments, a suitable etching process (e.g., wet etch) is performed to remove lower portions of layers of blocking material, memory material, tunneling material, and semiconductor material (i.e., 230a, 230b, 230c, and 230d) and the portion of bottom sacrificial layer 216 under initial plug opening 234a. The etching process may be isotropic so that the materials surrounding initial plug opening 234a are removed vertically and laterally until the desired dimensions of plug opening 234 are reached and/or the HVPW is exposed. In some embodiments, plug opening 234 is under layers of blocking material, memory material, tunneling material, and semiconductor material (i.e., 230a, 230b, 230c, and 230d) and exposing HVPW of substrate 202. In some embodiments, the sidewalls of plug opening 234 laterally expands into layer of blocking material 230a. In some embodiments, a top surface of plug opening 234 is below a top surface of the initial bottom sacrificial layer 210b (i.e., the sacrificial layer directly above and in contact of bottom sacrificial layer 216). In operation D, another layer of the semiconductor material (e.g., polysilicon) can be deposited over a layer of semiconductor material 230d and fill up plug opening 234. Semiconductor plug 240g can be formed. Any suitable deposition process, e.g., CVD, PVD, ALD, and/or sputtering, can be employed to form semiconductor plug 240g. Optionally, the deposition process can form air gaps 246 in semiconductor plug 240g. Semiconductor plug 240g may be conductively connected to a layer of semiconductor material 230d and HVPW.

At operation E, a layer of a dielectric core material 230e can be deposited, employing any suitable deposition methods such as CVD, PVD, ALD, and/or sputtering, to fill up opening 230. At operation F, a suitable planarization process (e.g., CMP and/or recess etch) can be performed to remove layers of the dielectric core material 230e, and layers of semiconductor material 230d and tunneling material 230c so that layer of memory material 230b can be exposed. At operation G, upper portions of layers of memory material, tunneling material, semiconductor material, and dielectric core material (i.e., 230b, 230c, 230d, and 230e) can be removed to form a channel-plug opening, e.g., by a suitable etching process (e.g., dry etch and/or wet etch), and a layer of conductive material 232 is deposited to fill up the channel-plug opening. Layer of conductive material 232 may be deposited using any suitable deposition methods such as CVD, PVD, ALD, and/or sputtering. The etched layers of memory material, tunneling material, semiconductor material, and dielectric core material (i.e., 230b, 230c, 230d, and 230e) can then form memory layer 240b, tunneling layer 240c, semiconductor layer 240d, and dielectric core 240e. The layer of blocking material 230a can form blocking layer 240a. At operation H, a planarization process (e.g., CMP and/or recess etch) can be performed to remove excess portions of conductive material 232 over dielectric deck 214 to form channel plug 240f. Memory string 240, including blocking layer 240a, memory layer 240b, tunneling layer 240c, semiconductor layer 240d, channel plug 240f, and semiconductor plug 240g, can be formed. A layer of insulating material can be deposited to cover memory string 240. A planarization process (e.g., CMP and/or recess etch) can be performed to remove excessive portions of the insulating material and form insulating cap layer 244 over dielectric deck 214.

FIG. 4B illustrates a flowchart to form an exemplary 3D memory device (e.g., memory device 100) having a plurality of memory decks stacking along the vertical direction, according to some embodiments. For ease of illustration, the fabrication process of memory device 100, having a lower memory deck (e.g., a first memory deck) and an upper memory deck (e.g., a second memory deck), is described as an example. The operations described in FIGS. 2A-2I and FIG. 4A illustrate the fabrication process to form the lower memory deck 104A (e.g., first memory deck) from a first dielectric deck 214. The operations described in FIG. 4B illustrate the fabrication process to form an upper memory deck 104B (e.g., the second memory deck) from a second dielectric deck. The operations to form more memory decks over the upper memory deck should be similar to the processes to form the lower and the upper memory decks and are not repeated herein. As used herein, the lower and upper memory decks can each be referred to as a memory deck of memory device 100, and the memory strings (e.g., 108-1 and 108-2) in each memory deck can each be referred to as memory sub-strings.

At the beginning of the fabrication process, at operations 452 and 454, a bottom sacrificial layer may be formed over a substrate, and a first dielectric deck having a plurality of interleaved sacrificial layers and dielectric layers can be formed over the bottom sacrificial layer. The fabrication process can be similar to or the same as the fabrication process illustrated in FIGS. 2A-2C. In some embodiments, the first dielectric deck is fabricated to subsequently form first memory deck 104A. At operation 456, a first memory string, extending through the first dielectric deck and the bottom sacrificial layer and contacting the substrate, can be formed. The fabrication process can be similar to or the same as the fabrication process illustrated in FIGS. 2D-2E and FIG. 3. In some embodiments, the first memory string (e.g., a memory sub-string) corresponds to memory sub-string 108-1 and includes a channel plug (e.g., 108f) at the upper portion, a semiconductor plug 108g at the lower portion and conductively connected to the substrate, and a semiconductor channel conductively connected to semiconductor plug 108g and channel plug 108f.

At operation 458, a second dielectric deck having a plurality of second interleaved sacrificial layers and dielectric layers can be formed over the first dielectric deck. The formation of the second dielectric deck can be the same as or similar to the formation of the first dielectric deck. In some embodiments, the second dielectric deck is fabricated to subsequently form second memory deck 104B. At operation 460, a second memory string, extending through the second dielectric deck and connecting with the first memory string, can be formed. In some embodiments, the second memory string corresponds to memory sub-string 108-2, which is aligned with memory sub-string 108-1 along the vertical direction. The fabrication process can be similar to or the same as the fabrication process illustrated in FIGS. 2D-2E. Different from the fabrication process shown in FIGS. 2D-2E, no semiconductor plug is formed in second memory deck 104B, and the semiconductor channel of the second memory string is conductively connected to the channel plug of the first memory string.

At operation 462, the bottom sacrificial layer can be replaced with a bottom dielectric layer between the first dielectric deck and the substrate. The fabrication process can be similar to or the same as the fabrication process illustrated in FIGS. 2F-2G. In some embodiments, an initial slit structure is formed extending through the first and second dielectric decks to expose the substrate, e.g., for the replacement of bottom sacrificial layer and subsequent operations. At operation 464, a source structure, extending through the first and the second memory decks and into the substrate, can be formed. In some embodiments, the plurality of first and second sacrificial layers are replaced with a plurality of conductor layers before the formation of the source structure. The first dielectric deck and the second dielectric deck can respectively form the first memory deck (e.g., 104A) and the second memory deck (e.g., 104B). The fabrication process to form the conductor layers, the first and the second memory decks, and the source structure can be similar to or the same as the fabrication process illustrated in FIGS. 2H-2I. In some embodiments, a top doped region (e.g., 114) and/or a source plug (e.g., 116) are respectively formed in the upper portions of channel plug (e.g., 112) and source plug 116 by a suitable ion implantation and/or a deposition of a conductive material in a recessed portion of the channel plug and the source conductor.

In some embodiments, a 3D memory device includes a substrate, a memory deck, and a memory string. The memory deck includes a plurality of interleaved conductor layers and dielectric layers on the substrate. The memory string extends vertically through the memory deck. A bottom conductor layer of the plurality of interleaved conductor layers and dielectric layers can intersect with and contact the memory string.

In some embodiments, the memory string includes a semiconductor plug connected to the substrate at a lower portion of the memory string.

In some embodiments, a top surface of the semiconductor plug is lower than a top surface of the bottom conductor layer.

In some embodiments, the semiconductor plug is a deposited poly-silicon plug.

In some embodiments, the memory string includes a semiconductor channel along a sidewall of the memory string and extending along the memory string to contact the semiconductor plug.

In some embodiments, the 3D memory device further includes a bottom dielectric layer between the memory deck and the substrate. The semiconductor plug may be in the bottom dielectric layer and the bottom dielectric layer has a thickness in a range of about 10 nm to about 50 nm.

In some embodiments, the 3D memory device further includes a support pillar extending through the memory deck and the bottom dielectric layer to contact the substrate.

In some embodiments, a lateral diameter of the support pillar is less than a lateral diameter of the memory string, and the support pillar is filled with silicon oxide.

In some embodiments, the 3D memory device further includes a source structure extending through the memory deck and into the substrate. The source structure may include a doped semiconductor region in the substrate, an insulating structure over the doped semiconductor region and the plurality of conductor layers, and a source conductor in the insulating structure. The source conductor may be electrically connecting the doped semiconductor region and being insulated from the plurality of conductor layers by the insulating structure.

In some embodiments, a 3D memory device includes a substrate, a memory stack, and a memory string. The memory stack includes a plurality of memory decks each having a plurality of interleaved conductor layers and dielectric layers over the substrate. The memory string includes a plurality of memory sub-strings extending vertically through the memory stack, each memory deck having a respective memory sub-string. A bottom conductor layer of the plurality of interleaved conductor layers and dielectric layers may intersect with and contact the memory string.

In some embodiments, the memory string includes a semiconductor plug connected to the substrate at a lower portion of the memory string.

In some embodiments, a top surface of the semiconductor plug is lower than a top surface of the bottom conductor layer.

In some embodiments, the semiconductor plug includes a deposited poly-silicon plug.

In some embodiments, the memory string includes a semiconductor channel along a sidewall of the memory string and extending along the memory string to contact the semiconductor plug.

In some embodiments, the 3D memory device further includes a bottom dielectric layer between the memory stack and the substrate. The semiconductor plug may be in the bottom dielectric layer and the bottom dielectric layer has a thickness in a range of about 10 nm to about 50 nm.

In some embodiments, memory sub-strings of adjacent memory decks are aligned with one another along an extending direction of the memory string and are connected by a channel plug, the channel plug having a conductive material.

In some embodiments, the 3D memory device further includes a source structure extending through the memory stack and the bottom dielectric layer and into the substrate. The source structure may include a doped semiconductor region in the substrate, an insulating structure over the doped semiconductor region and the plurality of conductor layers, and a source conductor in the insulating structure. The source conductor may be electrically connected to the doped semiconductor region and insulated from the plurality of conductor layers by the insulating structure.

In some embodiments, a method for forming a 3D memory device includes the following operations. First, a bottom sacrificial layer is formed over a substrate. A dielectric deck having a plurality of interleaved sacrificial layers and dielectric layers is formed over the bottom sacrificial layer. A memory string is then formed extending through the dielectric deck and the bottom sacrificial layer and contacting the substrate. A support pillar is formed extending through the dielectric deck and the bottom sacrificial layer to contact the substrate. Further, the bottom sacrificial layer is replaced with a bottom dielectric layer between the dielectric deck and the substrate. A source structure is then formed extending through the dielectric deck and into the substrate.

In some embodiments, forming the bottom sacrificial layer includes depositing a layer of an etch-stop material over the dielectric deck on the substrate. The etch-stop material can be different from a material of the plurality of sacrificial layers.

In some embodiments, the depositing the layer of sacrificial material includes depositing at least one of tungsten, cobalt, aluminum, or copper.

In some embodiments, forming the memory string includes the following operations. First, an opening is formed extending through the dielectric deck to expose the bottom sacrificial layer. A semiconductor plug is formed at a lower portion of the opening, the semiconductor plug extending through the bottom sacrificial layer and contacting the substrate. A semiconductor channel is formed extending along a sidewall of the opening and contacting the semiconductor plug. A channel plug is then formed over and contacting the semiconductor channel.

In some embodiments, forming the semiconductor plug and the forming the semiconductor channel include the following operations. First, layers of a blocking material, a memory material, a tunneling material, and a semiconductor material are deposited sequentially over the sidewall of the opening. A plug opening is formed under the layers of the memory material, the tunneling material, and the semiconductor material and through the bottom sacrificial layer to expose the substrate. Another layer of the semiconductor material is formed over the layer of the semiconductor material to fill up the plug opening. A dielectric core material is then deposited to fill up the opening. The dielectric deck is planarized to remove top portions of the layers of the dielectric core material, the semiconductor material, the tunneling material, and the memory material. Upper portions of the layers of the dielectric core material, the semiconductor material, the tunneling material, and the memory material are removed to form a channel-plug opening over the layers of the dielectric core material, the semiconductor material, the tunneling material, and the memory material. A layer of conductive material is deposited to fill up the channel-plug opening to respectively form the dielectric core, the semiconductor layer, the tunneling layer, the memory layer, and the blocking layer. The layer of conductive material is then planarized to form the channel plug.

In some embodiments, forming the plug opening includes forming an initial plug opening through the layers of the blocking material, the memory material, the tunneling material, and the semiconductor material to expose the bottom sacrificial layer. A lateral dimension of the initial plug opening may be less than a lateral dimension of the plug opening. Forming the plug opening also includes removing, by enlarging the initial plug opening, lower portions of the layers of the blocking material, the memory material, the tunneling material, and the semiconductor material, and a portion of the bottom sacrificial layer to expose the substrate so the plug opening is under the layers of the memory material, the tunneling material, and the semiconductor material and exposing the substrate.

In some embodiments, forming the initial plug opening includes performing a dry etch process to remove portions of the layers of the blocking material, the memory material, the tunneling material, and the semiconductor material to expose the bottom sacrificial layer; enlarging the initial plug opening includes performing a wet etch process to increase the lateral dimension and a vertical dimension of the initial plug opening.

In some embodiments, forming the support pillar includes forming a pillar opening extending through the dielectric deck and the bottom sacrificial layer to expose the substrate, and depositing a dielectric material to fill up the pillar opening.

In some embodiments, replacing the bottom sacrificial layer with a bottom dielectric layer includes forming, in a same operation that forms the pillar opening, a slit structure extending through the dielectric deck and the bottom sacrificial layer to expose the substrate, removing the dielectric material deposited over the slit structure to expose the bottom sacrificial layer and the substrate, and removing the bottom sacrificial layer. Replacing the bottom sacrificial layer may also include forming a bottom dielectric layer between the dielectric deck and the substrate.

In some embodiments, the removal of the bottom sacrificial layer includes a wet etch process.

In some embodiments, a formation of the bottom dielectric layer comprises at least one of the following operations. An operation includes a native oxide of the substrate by oxidizing the substrate, the substrate including silicon. Another operation includes performing an in situ steam generated oxidation process using oxygen gas and hydrogen gas. Another operation includes performing a silane oxidation reaction using oxygen gas and silane gas.

In some embodiments, the 3D memory device further includes replacing the plurality of sacrificial layers with a plurality of conductor layers after a removal of the dielectric material deposited over the slit structure.

In some embodiments, forming a source structure includes the following operations. First, a recess etch is performed on the plurality of conductor layers exposed on the sidewall of the slit structure. An ion implantation is performed to form a doped semiconductor region in the substrate at a bottom of the slit structure and under the bottom dielectric layer. An insulating structure is then formed to cover the plurality of conductor layers exposed on the sidewall of the slit structure. A bottom opening is formed in the bottom dielectric layer to expose the doped semiconductor region. A source conductor is then formed extending in the insulating structure and contacting the doped semiconductor region.

In some embodiments, a method for forming a 3D memory device includes the following operations. First, a bottom sacrificial layer is formed over a substrate. A first dielectric deck having a plurality of first interleaved sacrificial layers and dielectric layers is formed over the bottom sacrificial layer. A first memory string is formed extending through the first dielectric deck and the bottom sacrificial layer and contacting the substrate. A second dielectric deck having a plurality of second interleaved sacrificial layers and dielectric layers is then formed over the first dielectric deck. A second memory string is formed extending through the second dielectric deck and conductively connecting with the first memory string. The bottom sacrificial layer is replaced with a bottom dielectric layer between the first dielectric deck and the substrate. The plurality of first and second sacrificial layers is then replaced with a plurality of conductors to form a first and a second memory decks. A source structure is formed extending through the first and the second memory decks and into the substrate.

In some embodiments, forming the bottom sacrificial layer includes depositing a layer of an etch-stop material over the first dielectric deck on the substrate. The etch-stop material can be different from a material of the plurality of sacrificial layers.

In some embodiments, the depositing the layer of sacrificial material includes depositing at least one of tungsten, cobalt, aluminum, or copper.

In some embodiments, forming the first memory string includes the following operations. A first opening is formed extending through the first dielectric deck to expose the bottom sacrificial layer. A semiconductor plug is then formed at a lower portion of the first opening, the semiconductor plug extending through the bottom sacrificial layer and contacting the substrate. A first semiconductor channel is then formed extending along a sidewall of the first opening and contacting the semiconductor plug. A first channel plug is formed over and contacting the first semiconductor channel.

In some embodiments, forming the semiconductor plug and the forming the first semiconductor channel includes the following operations. First, layers of a blocking material, a memory material, a tunneling material, and a semiconductor material are subsequently deposited over the sidewall of the first opening. A plug opening is formed under the layers of the memory material, the tunneling material, and the semiconductor material and through the bottom sacrificial layer to expose the substrate. Another layer of the semiconductor material is formed over the layer of the semiconductor material to fill up the plug opening. A dielectric core material is then deposited to fill up the first opening. The first dielectric deck is planarized to remove top portions of the layers of the dielectric core material, the semiconductor material, the tunneling material, and the memory material. Upper portions of the layers of the dielectric core material, the semiconductor material, the tunneling material, and the memory material are removed to form a channel-plug opening over the layers of the dielectric core material, the semiconductor material, the tunneling material, and the memory material. A layer of conductive material is deposited to fill up the channel-plug opening to respectively form the dielectric core, the semiconductor layer, the tunneling layer, the memory layer, and the blocking layer. The layer of conductive material is then planarized to form the channel plug.

In some embodiments, forming the plug opening includes forming an initial plug opening through the layers of the blocking material, the memory material, the tunneling material, and the semiconductor material to expose the bottom sacrificial layer, a lateral dimension of the initial plug opening being less than a lateral dimension of the plug opening. Forming the plug opening may also include removing, by expanding the initial plug opening, lower portions of the layers of the blocking material, the memory material, the tunneling material, and the semiconductor material, and a portion of the bottom sacrificial layer to expose the substrate so the plug opening is under the layers of the memory material, the tunneling material, and the semiconductor material and exposing the substrate.

In some embodiments, forming a second dielectric deck includes forming a planarized insulating cap layer over the first dielectric deck, and depositing the plurality of second interleaved sacrificial layers and dielectric layers over the first dielectric deck.

In some embodiments, forming the second memory string includes forming a second opening extending through the second dielectric deck to expose the first channel plug, forming a second semiconductor channel extending along a sidewall of the second opening and contacting the first channel plug, and forming a second channel plug over and contacting the second semiconductor channel.

In some embodiments, replacing the bottom sacrificial layer with a bottom dielectric layer includes forming a slit structure extending through the first and the second dielectric decks and the bottom sacrificial layer to expose the substrate, removing the bottom sacrificial layer, and forming a bottom dielectric layer between the first dielectric deck and the substrate.

In some embodiments, the removal of the bottom sacrificial layer includes a wet etch process.

In some embodiments, a formation of the bottom dielectric layer includes at least one of the following operations. One operation includes forming a native oxide of the substrate by oxidizing the substrate, the substrate having silicon. Another operation includes performing an in situ steam generated oxidation process using hydrogen gas and oxygen gas. Another operation includes performing a silane oxidation reaction using oxygen gas and silane gas.

In some embodiments, forming a source structure includes the following operations. First, a recess etch is performed on the plurality of conductor layers exposed on the sidewall of the slit structure. An ion implantation is performed to form a doped semiconductor region in the substrate at a bottom of the slit structure. An insulating structure is then formed to cover the plurality of conductor layers exposed on the sidewall of the slit structure. A bottom opening is formed in the bottom dielectric layer to expose the doped semiconductor region. A source conductor is formed extending in the insulating structure and contacting the doped semiconductor region.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a substrate;
    a memory deck comprising a plurality of interleaved conductor layers and dielectric layers on the substrate;
    a memory string extending vertically through the memory deck and comprising a semiconductor plug at a lower portion of the memory string; and
    a bottom dielectric layer arranged between the memory deck and the substrate, a bottom surface of the memory deck being fully covered by the bottom dielectric layer,
    wherein:
    the semiconductor plug is surrounded by the bottom dielectric layer;
    a top surface of the semiconductor plug is higher than a top surface of the bottom dielectric layer;
    a top portion of sidewalls of the semiconductor plug is surrounded by and in contact with a blocking layer of the memory string, the blocking layer extending vertically through a topmost pair of the interleaved conductor layers and dielectric layers and a bottommost pair of the interleaved conductor layers and dielectric layers; and
    a bottom conductor layer of the plurality of interleaved conductor layers and dielectric layers intersect with and contact the memory string, and an entirety of a topmost surface of the semiconductor plug is lower than an entirety of a topmost surface of the bottom conductor layer in a cross section.

2. The 3D memory device of claim 1, wherein the semiconductor plug is connected to the substrate at the lower portion of the memory string.

3. The 3D memory device of claim 1, wherein the semiconductor plug is a deposited polysilicon plug.

4. The 3D memory device of claim 3, wherein the memory string comprises a semiconductor channel along a sidewall of the memory string and extending along the memory string to contact the semiconductor plug.

5. The 3D memory device of claim 4, wherein the semiconductor plug is in the bottom dielectric layer, and the bottom dielectric layer has a thickness in a range of about 10 nm to about 50 nm.

6. The 3D memory device of claim 5, further comprising a support pillar extending through the memory deck and the bottom dielectric layer to contact the substrate.

7. The 3D memory device of claim 6, wherein a lateral diameter of the support pillar is less than a lateral diameter of the memory string, and the support pillar is filled with silicon oxide.

8. The 3D memory device of claim 1, wherein:
a bottom portion of the sidewalls of the semiconductor plug is surrounded by the bottom dielectric layer.

9. The 3D memory device of claim 1, wherein:
a lateral dimension of the bottom dielectric layer corresponds to a lateral dimension of the bottommost pair of the interleaved conductor layers and dielectric layers.

10. The 3D memory device of claim 1, wherein:
a bottom surface of the bottom conductor layer of the memory deck is in direct contact with and fully covered by the bottom dielectric layer.

11. The 3D memory device of claim 1, wherein:
a vertically top portion of outer sidewalls of the semiconductor plug is surrounded by the blocking layer that comprises a dielectric material.

12. A three-dimensional (3D) memory device, comprising:
a substrate;
a memory stack comprising a plurality of memory decks each having a plurality of interleaved conductor layers and dielectric layers over the substrate;
a memory string having a plurality of memory sub-strings extending vertically through the memory stack and comprising a semiconductor plug at a lower portion of the memory string, each memory deck corresponding to a respective memory sub-string; and
a bottom dielectric layer arranged between the memory stack and the substrate, a bottom surface of a bottom conductor layer of the memory stack being in direct contact with and fully covered by the bottom dielectric layer, and a portion of the semiconductor plug being arranged within the bottom dielectric layer,
wherein:
the semiconductor plug comprises polysilicon;
a topmost surface of the semiconductor plug is higher than a topmost surface of the bottom dielectric layer, and an entirety of the topmost surface of the semiconductor plug is lower than an entirety of a topmost surface of the bottom conductor layer in a cross section; and
the bottom conductor layer of the plurality of interleaved conductor layers and dielectric layers intersect with and contact the memory string.

13. The 3D memory device of claim 12, wherein the semiconductor plug is connected to the substrate at the lower portion of the memory string.

14. The 3D memory device of claim 12, wherein the semiconductor plug comprises a deposited polysilicon plug.

15. The 3D memory device of claim 14, wherein the memory string comprises a semiconductor channel along a sidewall of the memory string and extending along the memory string to contact the semiconductor plug.

16. The 3D memory device of claim 15, wherein the bottom dielectric layer has a thickness in a range of about 10 nm to about 50 nm.

17. The 3D memory device of claim 12, wherein:
a top portion of sidewalls of the semiconductor plug is surrounded by and in contact with a blocking layer of the memory string, the blocking layer extending vertically through a topmost pair of the interleaved conductor layers and dielectric layers and a bottommost pair of the interleaved conductor layers and dielectric layers; and
a bottom portion of the sidewalls of the semiconductor plug is surrounded by the bottom dielectric layer.

18. A three-dimensional (3D) memory device, comprising:
a substrate;
a memory deck comprising a plurality of interleaved conductor layers and dielectric layers on the substrate; and
a memory string extending vertically through the memory deck and comprising a semiconductor plug at a lower portion of the memory string,
wherein:
a top portion of the semiconductor plug is surrounded by the memory deck, and a bottom portion of the semiconductor plug is surrounded by a bottom dielectric layer, the bottom dielectric layer being arranged between the memory deck and the substrate, and a bottom surface of a bottom conductor layer of the memory deck being in direct contact with and fully covered by the bottom dielectric layer;
the bottom conductor layer of the plurality of interleaved conductor layers and dielectric layers intersect with and contact the memory string; and
an entirety of a topmost surface of the semiconductor plug is lower than an entirety of a topmost surface of the bottom conductor layer in a cross section.

19. The 3D memory device of claim 18, wherein the topmost surface of the semiconductor plug is higher than a topmost surface of the bottom dielectric layer in the cross section.

20. The 3D memory device of claim 18, wherein:
a top portion of sidewalls of the semiconductor plug is surrounded by and in contact with a blocking layer of the memory string, the blocking layer extending vertically through a topmost pair of the interleaved conductor layers and dielectric layers and a bottommost pair of the interleaved conductor layers and dielectric layers; and
a bottom portion of the sidewalls of the semiconductor plug is surrounded by the bottom dielectric layer.

* * * * *